US012598877B2

(12) United States Patent
Yoon et al.

(10) Patent No.: US 12,598,877 B2
(45) Date of Patent: Apr. 7, 2026

(54) STRETCHABLE DISPLAY APPARATUS

(71) Applicant: SAMSUNG DISPLAY CO., LTD., Yongin-si (KR)

(72) Inventors: Jangyeol Yoon, Yongin-si (KR); Dongchul Shin, Yongin-si (KR); Inseon Yoon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 821 days.

(21) Appl. No.: 17/939,399

(22) Filed: Sep. 7, 2022

(65) Prior Publication Data

US 2023/0082602 A1     Mar. 16, 2023

(30) Foreign Application Priority Data

Sep. 10, 2021    (KR) ........................ 10-2021-0121175

(51) Int. Cl.
*H10K 59/131*          (2023.01)

(52) U.S. Cl.
CPC .................................. *H10K 59/131* (2023.02)

(58) Field of Classification Search
CPC ...................................................... H10K 59/131
See application file for complete search history.

(56) References Cited

U.S. PATENT DOCUMENTS 6,743,892 B1     6/2004   Biegelsen et al.
9,450,125 B2     9/2016   Lee

| | | | |
|---|---|---|---|
| 10,008,695 B2 | 6/2018 | Park et al. | |
| 11,737,320 B2 | 8/2023 | Park et al. | |
| 2017/0294610 A1* | 10/2017 | Sasaki ................... | H10K 59/131 |
| 2018/0052493 A1* | 2/2018 | Hong ....................... | G06F 3/044 |
| 2018/0114825 A1* | 4/2018 | Hong ...................... | H10K 59/38 |
| 2019/0198782 A1* | 6/2019 | Kim ....................... | H10K 59/131 |
| 2019/0280077 A1* | 9/2019 | Park ...................... | H10K 77/111 |
| 2020/0168824 A1* | 5/2020 | Park ...................... | H10K 77/111 |
| 2020/0343463 A1 | 10/2020 | Lee et al. | |
| 2020/0388666 A1* | 12/2020 | Park ........................ | H10D 86/60 |
| 2021/0210523 A1 | 7/2021 | Sui et al. | |

FOREIGN PATENT DOCUMENTS

| | | |
|---|---|---|
| CN | 109064900 | 12/2018 |
| CN | 109830510 A | 5/2019 |
| CN | 109920334 A | 6/2019 |
| CN | 110189640 A | 8/2019 |
| CN | 112150934 A | 12/2020 |
| CN | 112562515 A | 3/2021 |
| KR | 1020170064633 A | 6/2017 |
| KR | 1020200124852 A | 11/2020 |
| KR | 1020200140980 A | 12/2020 |

* cited by examiner

*Primary Examiner* — Lex H Malsawma
(74) *Attorney, Agent, or Firm* — CANTOR COLBURN LLP

(57)          ABSTRACT

A display apparatus includes a display panel in which a penetration opening is defined. The display panel includes a first display part on which a first pixel is disposed, a second display part on which a second pixel is disposed, and a connection part connected between the first display part and the second display part. The display apparatus further includes a first pattern overlapping the first display part and adjacent to the connection part, a second pattern overlapping the connection part and adjacent to the first display part, and a third pattern overlapping the connection part and adjacent to the second display part.

20 Claims, 42 Drawing Sheets

STRETCHABLE DISPLAY APPARATUS

This application claims priority to Korean Patent Application No. 10-2021-0121175, filed on Sep. 10, 2021, and all the benefits accruing therefrom under 35 U.S.C. § 119, the content of which in its entirety is herein incorporated by reference.

BACKGROUND

1. Field

One or more embodiments relate to a display apparatus.

2. Description of the Related Art

Mobile electronic devices are widely used in various fields. As mobile electronic devices, not only small electronic apparatuses such as mobile phones but also tablet personal computers ("PC"s) have been widely used in recent years.

Such mobile electronic devices include display apparatuses to provide various functions, for example, to provide visual information such as images or videos to users. Recently, as other parts for driving display apparatuses have been miniaturized, the proportion occupied by display apparatuses in electronic devices has gradually been increasing.

Recently, flexible display apparatuses that are bendable, foldable, or rollable have been under research and development. Furthermore, stretchable display apparatuses capable of being changed into various shapes are also under research and development.

SUMMARY

One or more embodiments include display apparatuses with improved flexibility.

According to one or more embodiment, a display apparatus includes a display panel in which a penetration opening is defined, where the display panel includes a first display part on which a first pixel is disposed, a second display part on which a second pixel is disposed, and a connection part connected between the first display part and the second display part, and where the display apparatus further includes a first pattern overlapping the first display part and adjacent to the connection part, a second pattern overlapping the connection part and adjacent to the first display part, and a third pattern overlapping the connection part and adjacent to the second display part.

In an embodiment, the first pattern may be on an upper surface of the first display part.

In an embodiment, the second pattern and the third pattern may be on an upper surface of the connection part.

In an embodiment, at least one of the second pattern and the third pattern may be recessed into the connection part.

In an embodiment, a width of the connection part may be greater than or equal to a width of the second pattern in a plan view.

In an embodiment, a modulus of the second pattern may be different from a modulus of the connection part.

In an embodiment, an edge of the first display part, an edge of the second display part, and an edge of the connection part may define at least a portion of the penetration opening.

In an embodiment, an edge of the first display part may include a plurality of concave parts recessed into the first display part in a plan view.

In an embodiment, a width of the connection part in a plan view may gradually increase from a central portion of the connection part toward an outer portion of the connection part adjacent to the first display part.

In an embodiment, an edge of the connection part may have a straight-line shape or a curved shape in a plan view.

In an embodiment, the connection part may include a first connection part and a second connection part, and the first connection part and the second connection part may be symmetrical with respect to an imaginary line extending in a first direction.

In an embodiment, the connection part may include a first part adjacent to the first display part, a second part adjacent to the second display part, and a third part between the first part and the second part.

In an embodiment, a width of the first part may be different from a width of the third part in a plan view.

In an embodiment, a thickness of the third part may be less than a thickness of the first part in a side view.

In an embodiment, a thickness of the connection part may be less than a thickness of the first display part in a side view.

According to one or more embodiments, a display apparatus includes a substrate including a display area and a non-display area outside the display area, a first display part, a second display part, and a first connection part connected between the first display part and the second display part, where the first display part, the second display part, and the first connection part are on the display area of the substrate, and a first driver, a second driver, and a second connection part connected between the first driver and the second driver, where the first driver, the second driver, and the second connection part are on the non-display area of the substrate.

In an embodiment, the display apparatus may further include a first pattern overlapping the first display part and adjacent to the connection part, a second pattern overlapping the connection part and adjacent to the first display part, and a third pattern overlapping the connection part and adjacent to the second display part.

In an embodiment, the first pattern may be on an upper surface of the first display part.

In an embodiment, the second pattern and the third pattern may be on an upper surface of the connection part.

In an embodiment, at least one of the second pattern and the third pattern may be recessed into the connection part.

BRIEF DESCRIPTION OF THE DRAWINGS

The above features of certain embodiments of the disclosure will be more apparent from the following description taken in conjunction with the accompanying drawings, in which:

FIG. 22 is a plan view schematically illustrating a portion of a display apparatus, according to an embodiment.

DETAILED DESCRIPTION

Figure 1:
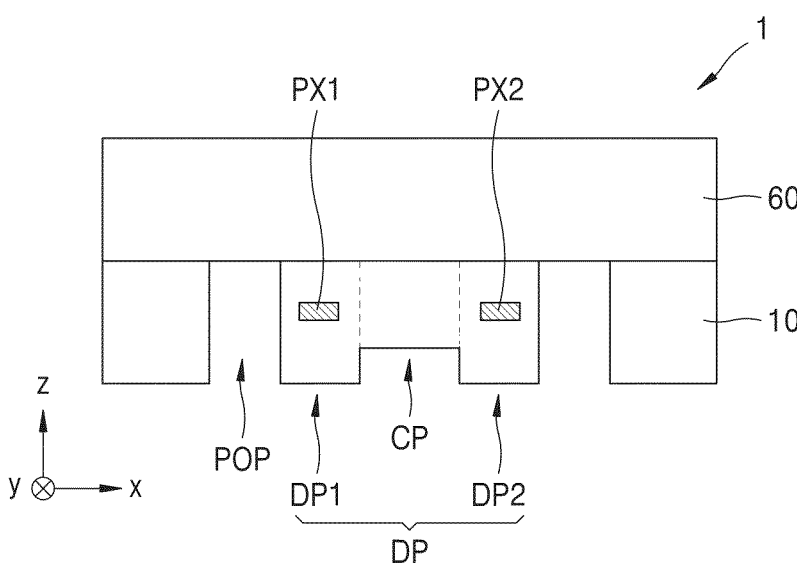
FIG. 1 is a cross-sectional view schematically illustrating a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

As the description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be further understood that, when a layer, region, or element is referred to as being "on" another layer, region, or element, it may be directly or indirectly on the other layer, region, or element. That is, for example, intervening layers, regions, or elements may be present. In contrast, when an element is referred to as being "directly on" another element, there are no intervening elements present.

Also, sizes of elements in the drawings may be exaggerated or reduced for convenience of explanation. For example, because sizes and thicknesses of elements in the drawings are arbitrarily illustrated for convenience of explanation, the disclosure is not limited thereto.

"Or" means "and/or." As used herein, the term "and/or" includes any and all combinations of one or more of the associated listed items. In this specification, the expression "A and/or B" indicates only A, only B, or both A and B. In this specification, the expression "at least one of A and B" indicates only A, only B, or both A and B.

In the following embodiments, the expression "a line extends in a first direction or a second direction" may include a case in which "a line extends in a linear shape" and a case in which "a line extends in a zigzag or curved shape in a first direction or a second direction."

In the following embodiments, the term "in a plan view" means seeing a target portion from above, and the term "in a cross-sectional view" means seeing a vertically cut cross-section of a target portion from side. In the following embodiments, the term "overlapping" may include overlapping "in a plan view" and "in a cross-sectional view."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described in detail with reference to the accompanying drawings. When describing embodiments with reference to the accompanying drawings, the same or corresponding elements are denoted by the same reference numerals.

An embodiment of a display apparatus is configured to display a moving image or a still image, and may be used as display screens of portable electronic devices such as mobile phones, smart phones, tablet personal computers ("PC"s), mobile communication terminals, electronic organizers, e-books, portable multimedia players ("PMP"s), navigations, and ultra mobile PCs ("UMPC"s). Also, a display apparatus may be used as display screens of various products such as televisions, laptops, monitors, billboards, and Internet of things ("IoT") devices. Also, an embodiment of a display apparatus may be used in wearable devices such as smart watches, watch phones, glasses-type displays, and head mounted displays ("HMD"s). Also, an embodiment of a display apparatus may be used in dashboards of automobiles, center information displays ("CID"s) on the center fascia or dashboards of automobiles, room mirror displays replacing side mirrors of automobiles, and displays on the rear sides of front seats to serve as entertainment devices for backseat passengers of automobiles.

Figure 2:
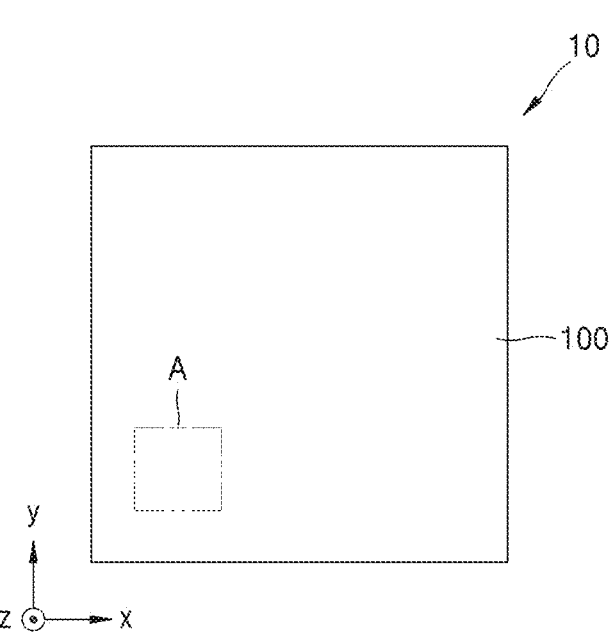
FIG. 2 is a plan view schematically illustrating a display apparatus according to an embodiment.

FIG. 1 is a cross-sectional view schematically illustrating a display apparatus 1 according to an embodiment, and FIG. 2 is a plan view schematically illustrating the display apparatus 1 according to an embodiment.

Referring to FIG. 1, an embodiment of the display apparatus 1 may include a display panel 10 and a cover window 60. The cover window 60 may be on the display panel 10.

The display panel 10 may display an image. The display panel 10 may include a plurality of pixels, for example, a first pixel PX1 and a second pixel PX2. The display panel 10 may display an image by using the pixels.

Each of the pixels may include a display element. In an embodiment, for example, the display panel 10 may include an organic light emitting display panel using an organic light emitting diode ("LED") including an organic emission layer. Alternatively, the display panel 10 may include an LED display panel using an LED. The size of the LED may be on a micro scale or a nano scale. In an embodiment, for example, the LED may include a micro LED. Alternatively, examples of the LED may include a nanorod LED. The nanorod LED may include gallium nitride (GaN). In an embodiment, a color conversion layer may be on the nanorod LED. The color conversion layer may include quantum dots. Alternatively, examples of the display panel 10 may include a quantum dot light emitting display panel using a quantum dot light emitting diode (quantum dot LED) including a quantum dot emission layer. Alternatively, the display panel 10 may include an inorganic light emitting display panel using an inorganic light emitting element including an inorganic semiconductor, for example. Hereinafter, for convenience of description, embodiments in which the display panel 10 is an organic light emitting display panel using an organic LED as a display element will be described in detail, but not being limited thereto.

The display panel 10 may include a first display part DP1, a second display part DP2, and a connection part CP. The first pixel PX1 may be in the first display part DP1. The second pixel PX2 may be in the second display part DP2. The connection part CP may be between the first display part DP1 and the second display part DP2. No pixels may be in the connection part CP. The connection part CP may extend from the first display part DP1 to the second display part DP2.

A penetration opening POP may be defined in the display panel 10. The penetration opening POP may pass or extend through the display panel 10. The penetration opening POP may be an area in which elements of the display panel 10 are not arranged. The display panel 10 may include a plurality of penetration openings POP. Therefore, the display panel 10 may be stretched and/or contracted.

The cover window 60 may protect the display panel 10. In an embodiment, the cover window 60 may be easily bent according to an external force, without generating cracks, to protect the display panel 10. The cover window 60 may be bonded to the display panel 10 by a transparent adhesive member such as an optically clear adhesive ("OCA") film.

The cover window 60 may include glass, sapphire, or plastic. The cover window 60 may include, for example, ultra-thin glass ("UTG") or colorless polyimide ("CPI"). In an embodiment, the cover window 60 may have a structure in which a flexible polymer layer is on one surface of a glass substrate, or may include only a polymer layer.

Referring to FIG. 2, the display panel 10 may include a substrate 100 and a multilayer film on the substrate 100. In an embodiment, the display panel 10 may include the penetration opening (see POP of FIG. 1), that is, the penetration opening is defined through the display panel 10. The substrate 100 and the multilayer film may not be in the penetration opening POP. In such an embodiment, the penetration opening POP may be an empty area of the display panel 10. The display panel 10 may include a plurality of penetration openings POP. In such an embodiment where the display panel 10 includes the penetration openings POP, the flexibility of the display apparatus (see 1 of FIG. 1) including the display panel 10 may be improved.

The substrate 100 may include glass or a polymer resin selected from polyethersulfone, polyarylate, polyether imide, polyethylene naphthalate, polyethylene terephthalate, polyphenylene sulfide, polyimide, polycarbonate, cellulose triacetate, and cellulose acetate propionate. The substrate 100 including the polymer resin may be flexible, rollable, and bendable. The substrate 100 may have a multilayer structure including a base layer and a barrier layer, each including the above-described polymer resin.

Figure 3:
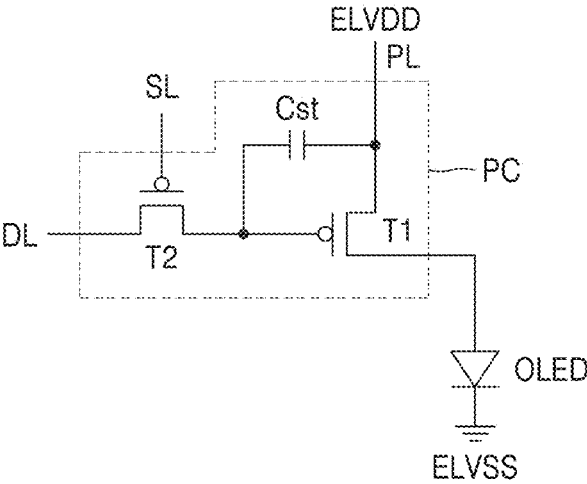
FIG. 3 is an equivalent circuit diagram schematically illustrating a pixel circuit applicable to a display apparatus, according to an embodiment.

FIG. 3 is an equivalent circuit diagram schematically illustrating a pixel circuit PC applicable to a display apparatus, according to an embodiment.

Referring to FIG. 3, in an embodiment, the pixel circuit PC may be connected to a display element, for example, an organic light emitting diode OLED. The pixel circuit PC may include a driving thin film transistor T1, a switching thin film transistor T2, and a storage capacitor Cst. The organic light emitting diode OLED may emit red light, green light, or blue light, or may emit red light, green light, blue light, or white light.

The switching thin film transistor T2 may be connected to a scan line SL and a data line DL, and may be configured to transmit, to the driving thin film transistor T1, a data signal or a data voltage input from the data line DL in response to a scan signal or a switching voltage input from the scan line SL. The storage capacitor Cst may be connected to the switching thin film transistor T2 and a driving voltage line PL, and may be configured to store a voltage corresponding to a difference between a voltage received from the switching thin film transistor T2 and a first power supply voltage ELVDD supplied to the driving voltage line PL.

The driving thin film transistor T1 may be connected to the driving voltage line PL and the storage capacitor Cst, and may be configured to control a driving current flowing from the driving voltage line PL to the organic light emitting diode OLED based on a voltage value stored in the storage capacitor Cst. The organic light emitting diode OLED may emit light having a certain luminance corresponding to the driving current. An opposite electrode of the organic light emitting diode OLED may receive a second power supply voltage ELVSS.

Although FIG. 3 illustrates an embodiment where the pixel circuit PC includes two thin film transistors and one storage capacitor, but not being limited thereto. Alternatively, the pixel circuit PC may include three or more thin film transistors and may include two or more storage capacitors.

Figure 4:
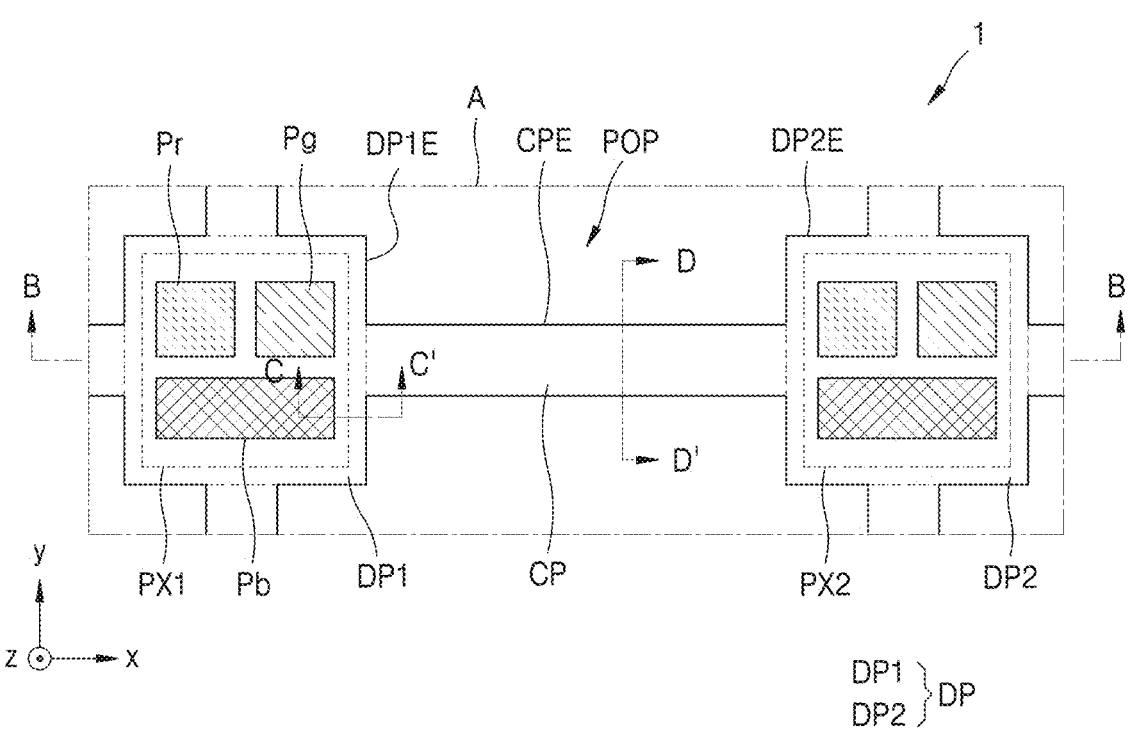
FIG. 4 is a plan view schematically illustrating a display apparatus according to an embodiment.

FIG. 4 is a plan view schematically illustrating a display apparatus 1 according to an embodiment. FIG. 4 is an enlarged view of region A of FIG. 2.

Referring to FIG. 4, the display apparatus 1 may include a display part DP and a connection part CP. The display part DP may include a first display part DP1 and a second display part DP2. In an embodiment, the display apparatus 1 may include a plurality of first display parts DP1 and a plurality of second display parts DP2. In an embodiment, the display apparatus 1 may include a plurality of connection parts CP.

The first pixel PX1 may be in the first display part DP1. The first display part DP1 may be apart from the second display part DP2. The first display part DP1 may be connected to the connection part CP. In an embodiment, the first display part DP1 may be connected to at least one connection part CP.

The second pixel PX2 may be in the second display part DP2. The second display part DP2 may be apart from the first display part DP1. The second display part DP2 may be connected to the connection part CP. In an embodiment, the second display part DP2 may be connected to at least one connection part CP. The second display part DP2 may have a structure similar to that of the first display part DP1.

The connection part CP may extend from the first display part DP1 to the second display part DP2. The first display part DP1 and the second display part DP2 may be connected to each other by the connection part CP. In an embodiment, where the display apparatus 1 includes a plurality of connection parts CP, the connection parts CP may be connected to the first display part DP1 and/or the second display part DP2. Alternatively, the connection parts CP may extend from the first display part DP1 and/or the second display part DP2.

One of the connection parts CP may extend in a first direction. Another of the connection parts CP may extend in a second direction crossing the first direction. In an embodiment, the first direction may be perpendicular to the second direction. In an embodiment, for example, the first direction may be the +x or −x direction of FIG. 4, and the second direction may be the +y or −y direction of FIG. 4. Alternatively, the first direction and the second direction may form an acute angle with each other, or may form an obtuse angle with each other. Hereinafter, for convenience of description, embodiments in which the first direction (e.g., the +x or −x direction) is perpendicular to the second direction (e.g., the +y or −y direction) will be described in detail, but not being limited thereto.

In an embodiment, the first display part DP1 and the connection part CP may be defined as one basic unit. In such an embodiment, the basic unit may be repeatedly arranged in the first direction (e.g., the +x or −x direction) and/or the second direction (e.g., the +y or −y direction), and it may be understood that the display apparatus 1 has a structure in which the basic units repeatedly arranged are connected to each other.

A penetration opening POP may be defined in the display panel 10. The penetration opening POP may pass through the display panel 10. Therefore, the penetration opening POP may be an area in which elements of the display panel 10 are not arranged. The display panel 10 may include a plurality of penetration openings POP. Therefore, the flexibility of the display panel 10 may be improved.

At least a portion of the penetration opening POP may be defined by an edge DP1 E of the first display part DP1, an edge DP2E of the second display part DP2, and an edge CPE of the connection part CP. In an embodiment, the penetration opening POP may have a closed curve shape. Alternatively, at least a portion of the penetration opening POP may have an open shape.

A thickness of the first display part DP1 and a thickness of the second display part DP2 may be greater than a thickness of the connection part CP. Therefore, even when strain is generated in the connection part CP, a maximum value of the strain generated in the connection part CP may be reduced.

Each of the first pixel PX1 and the second pixel PX2 may include a red sub-pixel Pr, a green sub-pixel Pg, and a blue sub-pixel Pb. The red sub-pixel Pr, the green sub-pixel Pg, and the blue sub-pixel Pb may emit red light, green light, and blue light, respectively. Alternatively, each of the first pixel PX1 and the second pixel PX2 may include a red sub-pixel Pr, a green sub-pixel Pg, a blue sub-pixel Pb, and a white sub-pixel. The red sub-pixel Pr, the green sub-pixel Pg, the blue sub-pixel Pb, and the white sub-pixel may emit red light, green light, blue light, and white light, respectively. Hereinafter, for convenience of description, embodiments in which each of the first pixel PX1 and the second pixel PX2 includes a red sub-pixel Pr, a green sub-pixel Pg, and a blue sub-pixel Pb will be described in detail, but not being limited thereto.

In an embodiment, the red sub-pixel Pr and the green sub-pixel Pg may be arranged in a rectangular shape, and the blue sub-pixel Pb may be arranged in a rectangular shape having a long side in the first direction (e.g., the +x or −x direction). In such an embodiment, the side of the red sub-pixel Pr and the side of the green sub-pixel Pg may be arranged to face the long side of the blue sub-pixel Pb. In an embodiment, the red sub-pixel Pr and the green sub-pixel Pg may be arranged in a first row, and the blue sub-pixel Pb may be arranged in a second row adjacent to the first row.

Alternatively, the sub-pixel arrangement structure of the first pixel PX1 may have an S-stripe structure. In an embodiment, for example, the blue sub-pixel Pb may be arranged in a first column, and the red sub-pixel Pr and the green sub-pixel Pg may be arranged in a second column adjacent to the first column. In such an embodiment, the blue sub-pixel Pb may be arranged in a rectangular shape having a long side in the second direction (e.g., the +y or −y direction), and the red sub-pixel Pr and the green sub-pixel Pg may be arranged in a rectangular shape.

Alternatively, the sub-pixel arrangement structure of the first pixel PX1 may have a stripe structure. In an embodiment, for example, the red sub-pixel Pr, the green sub-pixel Pg, and the blue sub-pixel Pb may be arranged in the first direction (e.g., the +x or −x direction) or in the second direction (e.g., the +y or −y direction). Alternatively, the sub-pixel arrangement structure of the first pixel PX1 may be a Pentile™ structure.

Referring to FIG. 4, the edge CPE of the connection part CP may extend in an extension direction of the connection part CP. In an embodiment, for example, where the connection part CP extends in the first direction (e.g., the +x or −x direction), the edge CPE of the connection part CP may also extend in the first direction (e.g., the +x or −x direction). In an embodiment, where the connection part CP extends in the second direction (e.g., the +y or −y direction), the edge CPE of the connection part CP may also extend in the second direction (e.g., the +y or −y direction).

Figure 5A:
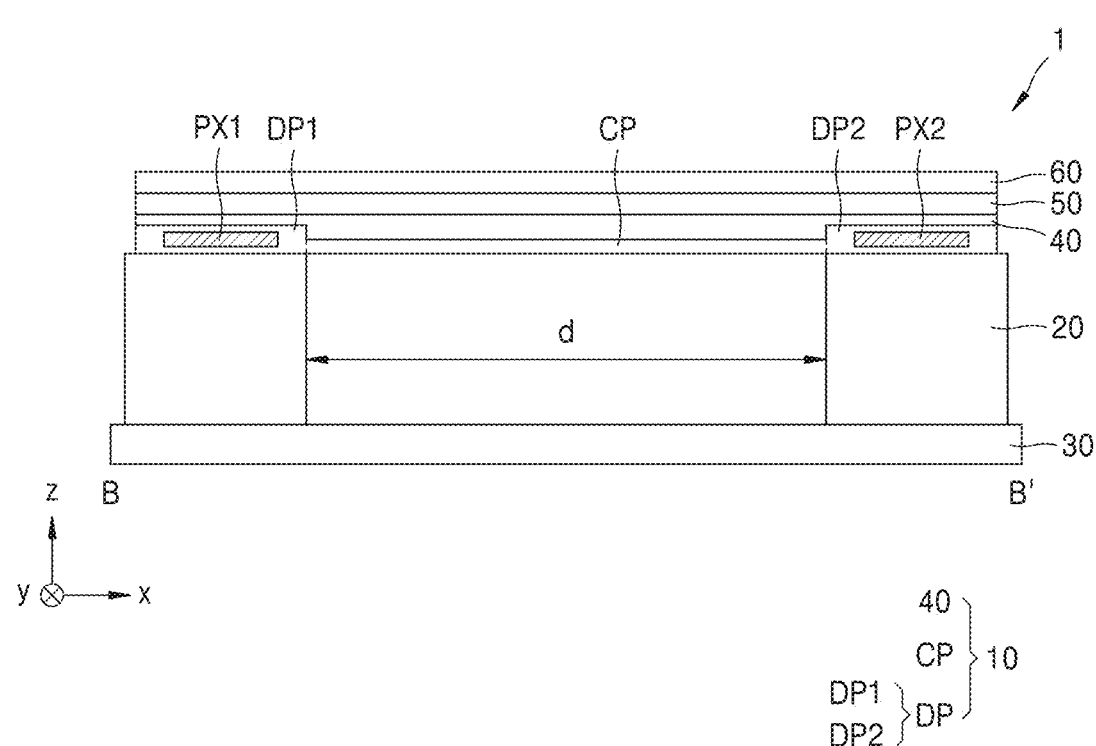
FIGS. 5A and 5B are cross-sectional views schematically illustrating a display apparatus according to an embodiment.
Figure 5B:
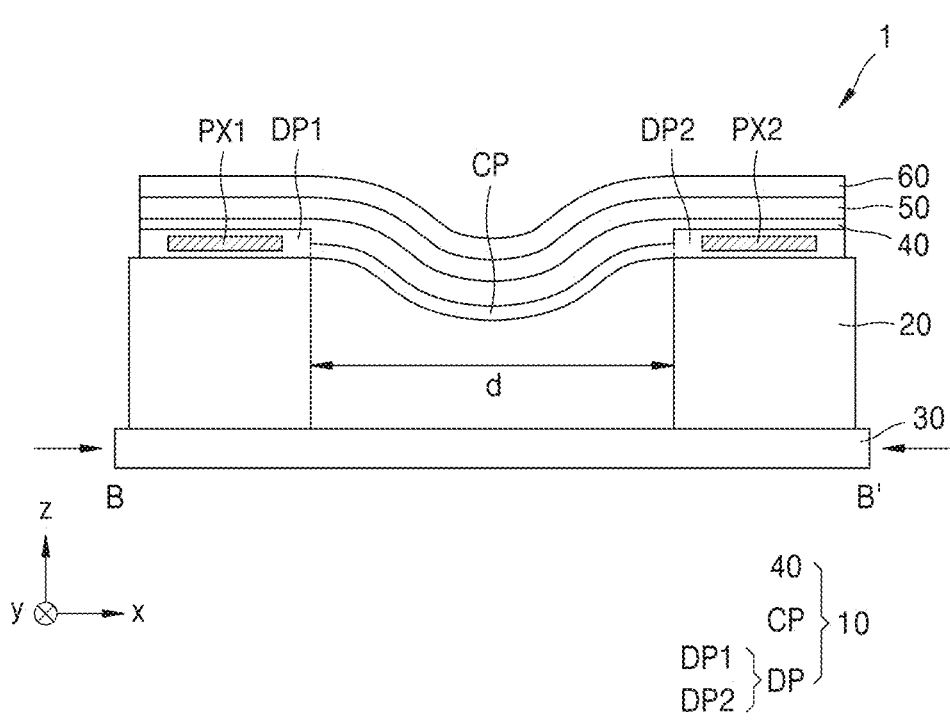
Figure 6:
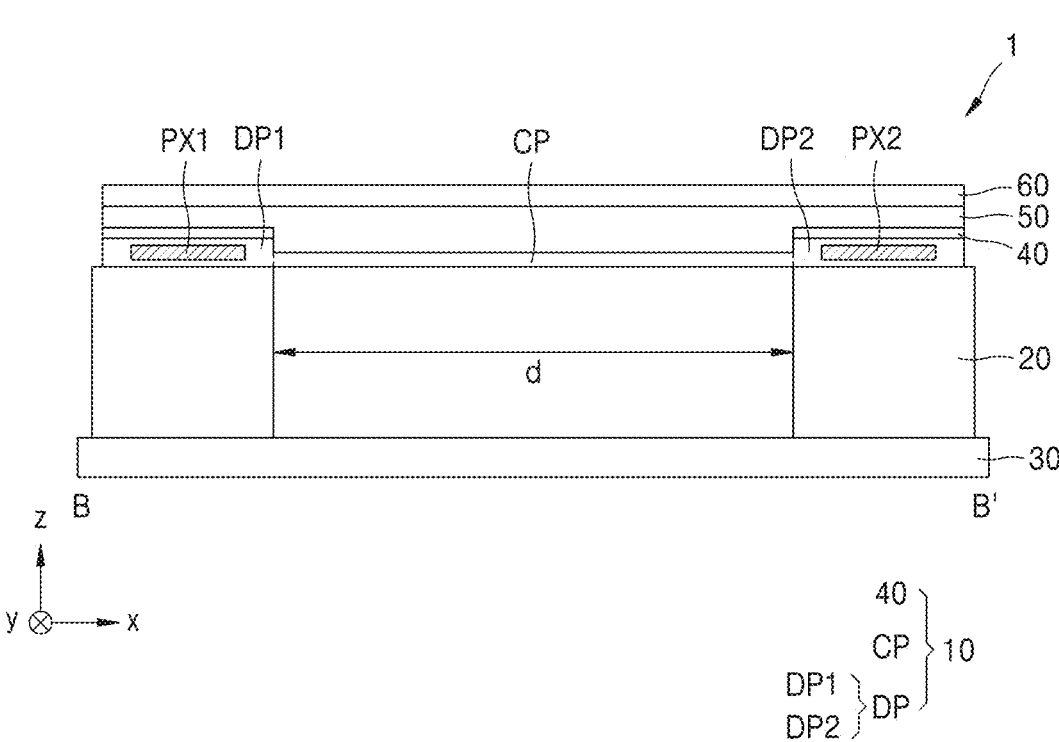
FIG. 6 is a cross-sectional view schematically illustrating a display apparatus according to an embodiment.

FIGS. 5A and 5B are cross-sectional views schematically illustrating a display apparatus 1 according to an embodiment, and FIG. 6 is a cross-sectional view schematically illustrating the display apparatus 1 according to an embodiment. Specifically, FIGS. 5A and 5B are cross-sectional view of the display apparatus 1 taken along line B-B' of FIG. 4, where FIG. 5A illustrates the display apparatus 1 before an external force is applied to the display apparatus 1, and FIG. 5B illustrates the display apparatus 1 after an external force is applied to the display apparatus 1. Also, the embodiment of FIG. 6 is substantially the same as the embodiment of FIG. 5A except for a structure of an encapsulation layer. The following description will focus on the embodiment of FIG. 5A, and the differences from the embodiment of FIG. 6 will be described.

Referring to FIG. 5A, an embodiment of the display apparatus 1 may include a display panel 10, a pillar layer 20, a flexible substrate 30, an optical function layer 50, and a cover window 60.

The display panel 10 may include a display part DP, a connection part CP, and an encapsulation layer 40. The display part DP may include a first display part DP1 and a second display part DP2. In such an embodiment, a first pixel PX1 may be in the first display part DP1, and a second pixel PX2 may be in the second display part DP2. The first display part DP1 and the second display part DP2 may be configured to display an image through the first pixel PX1 and the second pixel PX2, respectively. The connection part CP may connect the first display part DP1 to the second display part DP2. The first display part DP1 and the second display part DP2 may be connected to each other through the connection part CP.

Figure 7:
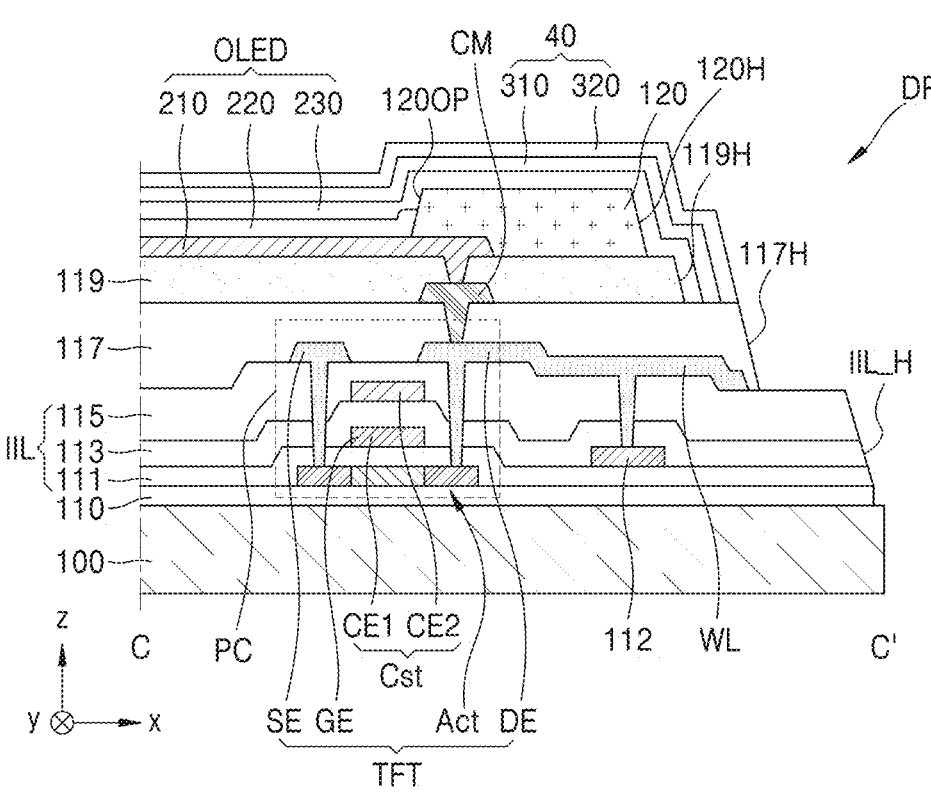
FIG. 7 is a cross-sectional view schematically illustrating a display apparatus according to an embodiment.

In an embodiment, as illustrated in FIG. 7 to be described below, the display part DP of the display panel 10 may include insulating layers. In an embodiment, some insulating layers included in the display part DP may be omitted from the connection part CP. Therefore, in such an embodiment where some insulating layers may be omitted from the connection part CP, a thickness of the connection part CP may be less than a thickness of the display part DP.

The pillar layer 20 may be under the display panel 10. The pillar layer 20 may support the display panel 10. Even when an external force is applied to the display apparatus 1, the shape of the pillar layer 20 may not change.

In an embodiment, the pillar layer 20 may be under the display part DP of the display panel 10. That is, the pillar layer 20 may overlap the display part DP and may not overlap the connection part CP. A plurality of pillar layers 20 may be apart from each other. The pillar layers 20 may be under a plurality of display parts DP apart from each other.

The flexible substrate 30 may be under the pillar layer 20. The flexible substrate 30 may overlap the display part DP and the connection part CP. The flexible substrate 30 may include a flexible material. The flexible substrate 30 may have flexibility higher than that of the pillar layer 20.

The encapsulation layer 40 may be on the display part DP and the connection part CP. The encapsulation layer 40 may cover the first pixel PX1 and the second pixel PX2. In an embodiment, the encapsulation layer 40 may include at least one inorganic layer. The at least one inorganic layer may include at least one inorganic insulating material selected from silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_x$), and may be formed by chemical vapor deposition ("CVD") or the like. Here, zinc oxide ($ZnO_x$) may be ZnO and/or $ZnO_2$.

In an embodiment, as illustrated in FIG. 5A, the encapsulation layer 40 may be on the display part DP and the connection part CP. Alternatively, as illustrated in FIG. 6, the encapsulation layer 40 may be on the display part DP. In such an embodiment, the encapsulation layer 40 may be on the display part DP, and may not be on the connection part CP. Therefore, the encapsulation layer 40 may have an opening corresponding to the connection part CP.

Although FIG. 5A illustrates an embodiment where the first pixel PX1 and the second pixel PX2 are covered with the encapsulation layer 40, the disclosure is not limited thereto. In an alternative embodiment, for example, the first pixel PX1 and the second pixel PX2 may be encapsulated by an encapsulation substrate.

The optical function layer 50 may be on the encapsulation layer 40. The optical function layer 50 may include an anti-reflection layer. The anti-reflection layer may reduce the reflectance of light (external light) incident from the outside toward the display apparatus 1. In an embodiment, the optical function layer 50 may be provided as or include a polarizing film. Alternatively, the optical function layer 50 may be provided as or include a filter plate including a black matrix and color filters.

Although not illustrated in FIG. 5A, a touch screen layer may be between the encapsulation layer 40 and the optical function layer 50. The touch screen layer may be configured to obtain coordinate information according to an external input, for example, a touch event. The touch screen layer may include a touch electrode and touch lines connected to the touch electrode. The touch screen layer may sense an external input by using a self-capacitance method or a mutual capacitance method.

The cover window 60 may be on the optical function layer 50. The cover window 60 may protect the display panel 10.

In an embodiment, as illustrated in FIG. 5B, when an external force is applied to the display apparatus 1 (e.g., when an external force is applied to the flexible substrate 30), the shapes and/or positions of some members of the display apparatus 1 may be changed. In an embodiment, for example, when a pressure is applied to the flexible substrate 30, a distance between the display parts DP of the display panel 10 or a distance d between the pillar layers 20 may decrease. Also, the connection part CP of the display panel 10 may be bent. At least a portion of the encapsulation layer 40, at least a portion of the optical function layer 50, and/or at least a portion of the cover window 60 may be bent.

In an embodiment, as described above, when an external force is applied to the display apparatus 1, the distance between the display parts DP of the display panel 10 or the distance d between the pillar layers 20 may change, and the shapes of the display parts DP of the display panel 10 and the pillar layers 20 may not change. Therefore, because the shapes of the display parts DP and the pillar layers 20 do not change, the first pixel PX1 and the second pixel PX2 in the display part DP may be protected. The shape of the display apparatus 1 may be variously changed while protecting the first pixel PX1 and the second pixel PX2.

FIG. 7 is a cross-sectional view schematically illustrating a display apparatus according to an embodiment. Specifically, FIG. 7 is a cross-sectional view of the display apparatus 1 taken along line C-C' of FIG. 4.

Hereinafter, the stack structure of the display part DP will be described in detail.

Referring to FIG. 7, in an embodiment, the display part DP includes a substrate 100, a buffer layer 110, a pixel circuit PC, an inorganic insulating layer IIL, a first planarization layer 117, a connection electrode CM, a second planarization layer 119, an organic light emitting diode OLED, a pixel defining layer 120, and an encapsulation layer 40.

The substrate 100 may include a base layer and a barrier layer. In an embodiment, the substrate 100 may include a first base layer, a first barrier layer, a second base layer, and a second barrier layer, which are sequentially stacked one on another. However, the disclosure is not limited thereto. Alternatively, at least one of the first barrier layer, the second base layer, and the second barrier layer may be omitted.

At least one of the first base layer and the second base layer may include a polymer resin selected from polyethersulfone, polyarylate, polyether imide, polyethylene naphthalate, polyethylene terephthalate, polyphenylene sulfide, polyimide, polycarbonate, cellulose triacetate, and cellulose acetate propionate.

The first barrier layer and the second barrier layer may be barrier layers that prevent infiltration of foreign material. The first barrier layer and the second barrier layer may prevent and reduce damage to the display part DP. The first barrier layer and the second barrier layer may have a single layer structure or a multiple layer structure, each layer therein including an inorganic material selected from silicon oxide ($SiO_x$), silicon nitride ($SiN_x$), and silicon oxynitride ($SiO_xN_y$).

The buffer layer 110 may be on the substrate 100. The buffer layer 110 may include an inorganic insulating material selected from silicon oxide ($SiO_x$), silicon nitride ($SiN_x$), and silicon oxynitride ($SiO_xN_y$), and may have a single layer structure or a multiple layer structure, each layer therein including at least one selected from the above-described inorganic insulating materials. In an embodiment, the buffer layer 110 may be omitted.

The pixel circuit PC may include a thin film transistor TFT and a storage capacitor Cst. The thin film transistor TFT may include a semiconductor layer Act, a gate electrode GE, a source electrode SE, and a drain electrode DE. The storage capacitor Cst may include a lower electrode CE1 and an upper electrode CE2.

The semiconductor layer Act may be on the buffer layer 110. The semiconductor layer Act may include polysilicon. Alternatively, the semiconductor layer Act may include amorphous silicon, an oxide semiconductor, or an organic semiconductor. The semiconductor layer Act may include a channel region, and a drain region and a source region on both sides of the channel region.

The gate electrode GE may be on the semiconductor layer Act. The gate electrode GE may overlap the channel region. The gate electrode GE may include a low-resistance metal material. The gate electrode GE may include a conductive material including molybdenum (Mo), aluminum (Al), copper (Cu), titanium (Ti), or the like, and may have a single layer structure or a multiple layer structure, each layer therein including at least one selected from the above-described conductive materials.

The inorganic insulating layer IIL may include a first insulating layer 111, a second insulating layer 113, and a third insulating layer 115. In an embodiment, a hole IIL_H that at least partially overlaps the penetration opening (see POP of FIG. 4) is defined through the buffer layer 110 and the inorganic insulating layer K. In such an embodiment, the buffer layer 110 and the inorganic insulating layer IIL may be on the display part DP, but may not be in the penetration opening POP. In an embodiment, the buffer layer 110 and the inorganic insulating layer IIL may not be in the connection part CP. In other such an embodiment, the buffer layer 110 and the inorganic insulating layer IIL include an opening overlapping the connection part CP.

A first insulating layer 111 may be between the semiconductor layer Act and the gate electrode GE. The first insulating layer 111 may include at least one inorganic insulating material selected from silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_x$). Here, zinc oxide ($ZnO_x$) may be ZnO and/or $ZnO_2$.

The second insulating layer 113 may be provided to cover the gate electrode GE. The second insulating layer 113 may include at least one inorganic insulating material selected from silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_x$). Here, zinc oxide ($ZnO_x$) may be ZnO and/or $ZnO_2$.

An upper electrode CE2 may be on the second insulating layer 113. The upper electrode CE2 may overlap the gate electrode GE thereunder. In an embodiment, the gate electrode GE of the thin film transistor TFT and the upper electrode CE2 overlapping each other with the second insulating layer 113 therebetween may form the storage capacitor Cst. In such an embodiment, the gate electrode GE of the thin film transistor TFT may function as the lower electrode CE1 of the storage capacitor Cst.

In an embodiment, as described above, the storage capacitor Cst and the thin film transistor TFT may overlap each other. However, the disclosure is not limited thereto. In an alternative embodiment, for example, the storage capacitor Cst may not overlap the thin film transistor TFT.

The upper electrodes CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer structure or a multiple layer structure, each layer therein including at least one selected from the above-described materials.

The third insulating layer 115 may be on the upper electrode CE2. The third insulating layer 115 may include at least one inorganic insulating material selected from silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_x$). Here, zinc oxide ($ZnO_x$) may be ZnO and/or $ZnO_2$.

The source electrode SE and the drain electrode DE may be on the third insulating layer 115. The source electrode SE and the drain electrode DE may include a material having good conductivity. The source electrode SE and the drain electrode DE may include a conductive material including molybdenum (Mo), aluminum (Al), copper (Cu), titanium (Ti), or the like, and may have a single layer structure or a multiple layer structure, each layer therein including at least one selected from the above-described conductive materials. In an embodiment, for example, the source electrode SE and the drain electrode DE may have a multilayer structure of Ti/Al/Ti.

A wiring WL may be on the third insulating layer 115. In an embodiment, the wiring WL may be integral with one of the source electrode SE and the drain electrode DE. However, the disclosure is not limited thereto. Alternatively, the wiring WL is provided as a separate element apart from the source electrode SE and the drain electrode DE.

In an embodiment, the wiring WL may be configured to transmit at least one of a power supply voltage, a data signal (or a data voltage), a scan signal (or a scan voltage), and an emission control signal (or an emission control voltage). In an embodiment, the wiring WL may be electrically connected to a conductive layer 112 thereunder. The wiring WL and the conductive layer 112 may be electrically connected to each other through contact holes defined in the second insulating layer 113 and the third insulating layer 115. The conductive layer 112 may be in or directly on a same layer as the gate electrode GE and may include a same material as that of the gate electrode GE.

Although not illustrated, an inorganic protection layer may be on the thin film transistor TFT and the wiring WL. The inorganic protection layer may cover and protect the source electrode SE, the drain electrode DE, and the wiring WL.

The first planarization layer 117 may be on the thin film transistor TFT and the wiring WL. The first planarization layer 117 may include an organic insulating material selected from general-purpose polymer such as polymethylmethacrylate ("PMMA") or polystyrene ("PS"), polymer derivatives having a phenolic group, acrylic polymer, imide polymer, aryl ether polymer, amide polymer, fluorine polymer, p-xylene polymer, vinyl alcohol polymer, and any blend thereof.

The connection electrode CM may be on the first planarization layer 117. The connection electrode CM may be connected to the drain electrode DE or the source electrode SE through a contact hole defined in the first planarization layer 117. The connection electrode CM may include a material having good conductivity. The connection electrode CM may include a conductive material including molybdenum (Mo), aluminum (Al), copper (Cu), titanium (Ti), or the like, and may have a single layer structure or a multiple layer structure, each layer therein including at least one selected from the above-described conductive materials. In an embodiment, for example, the connection electrode CM may have a multilayer structure of Ti/Al/Ti. Although not illustrated, an upper wiring may be on the first planarization layer 117. In an embodiment, the upper wiring may include a same material as that of the connection electrode CM.

The second planarization layer 119 may be arranged to cover the connection electrode CM. The second planarization layer 119 may include an organic insulating material selected from general-purpose polymer such as PMMA or PS, polymer derivatives having a phenolic group, acrylic polymer, imide polymer, aryl ether polymer, amide polymer, fluorine polymer, p-xylene polymer, vinyl alcohol polymer, and any blend thereof.

In an embodiment, although not illustrated, a third planarization layer may be further on the second planarization layer 119. In such an embodiment, an additional wiring may be further between the second planarization layer 119 and the third planarization layer.

The organic light emitting diode OLED may be on the second planarization layer 119. The organic light emitting diode OLED may be on the substrate 100 and may implement a pixel. The organic light emitting diode OLED may include a pixel electrode 210, an intermediate layer 220, and an opposite electrode 230.

The pixel electrode 210 may be on the second planarization layer 119. The pixel electrode 210 may be connected to the connection electrode CM through a contact hole defined in the second planarization layer 119. The pixel electrode 210 may include a conductive oxide selected from indium tin oxide ("ITO"), indium zinc oxide ("IZO"), zinc oxide (ZnO), indium oxide ($In_2O_3$), indium gallium oxide ("IGO"), and aluminum zinc oxide ("AZO"). Alternatively, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. Alternatively, the pixel electrode 210 may further include a layer including ITO, IZO, ZnO, or $In_2O_3$ above and/or below the reflective layer.

The pixel defining layer 120 having an opening 120OP exposing at least a portion of the pixel electrode 210 may be on the pixel electrode 210. The pixel defining layer 120 may include an organic insulating material and/or an inorganic insulating material. The opening 120OP defined in the pixel defining layer 120 may define an emission area of light emitted from the organic light emitting diode OLED. In an embodiment, for example, the width of the opening 120OP may correspond to the width of the emission area. In such an embodiment, the width of the opening 120OP may correspond to the width of the sub-pixel.

The intermediate layer 220 may be on the pixel electrode 210. The intermediate layer 220 may include a low molecular weight material or a high molecular weight material. In an embodiment where the intermediate layer 220 includes a low molecular weight material, the intermediate layer 220 may have a structure in which a hole injection layer ("HIL"), a hole transport layer ("HTL"), an emission layer ("EML"), an electron transport layer ("ETL"), and an electron injection layer ("EIL") are stacked in a single or complex structure, and may include various organic materials including copper phthalocyanine ("CuPc"), N,N-di(naphthalen-1-yl)-N,N'-diphenyl-benzidine ("NPB"), and tris-8-hydroxyquinoline aluminum ("Alq3"). These layers may be formed by vacuum deposition.

In an embodiment, where the intermediate layer 220 includes a high molecular weight material, the intermediate layer 220 may have a structure including an HTL and an EML. In such an embodiment, the HTL may include PEDOT, and the emission layer may include a polymer material such as poly-phenylenevinylene ("PPV") and polyfluorene. The intermediate layer 220 may be formed by screen printing, inkjet printing, laser induced thermal imaging ("LITI"), or the like.

However, the intermediate layer 220 is not limited thereto, and may have various structures. In an embodiment, the intermediate layer 220 may include an integral layer over a plurality of pixel electrodes 210, or may include a layer patterned to correspond to the pixel electrodes 210.

The opposite electrode 230 may be on the intermediate layer 220. The opposite electrode 230 may include a conductive material having a low work function. In an embodiment, for example, the opposite electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 230 may further include a layer such as ITO, IZO, ZnO, or $In_2O_3$ on the (semi) transparent layer including at least one selected from the above-described material. The intermediate layer 220 and the opposite electrode 230 may be formed by thermal evaporation.

A capping layer (not illustrated) protecting the opposite electrode 230 may be further on the opposite electrode 230. The capping layer may include LiF, an inorganic material, and/or an organic material.

In an embodiment, the encapsulation layer 40 may be on the opposite electrode 230. The encapsulation layer 40 may include at least one inorganic layer. The encapsulation layer 40 may include a first inorganic layer 310 and a second inorganic layer 320.

In an embodiment, holes 117H, 119H, and 120H that at least partially overlap the penetration opening POP are defined through the first planarization layer 117, the second planarization layer 119, and the pixel defining layer 120, respectively. The area of the hole 119H defined in the second planarization layer 119 may be greater than the area of the hole 117H defined in the first planarization layer 117. In an embodiment, the area of the hole 120H defined in the pixel defining layer 120 may be greater than the area of the hole 119H defined in the second planarization layer 119.

In an embodiment, an end of the opposite electrode 230 may be on the first planarization layer 117. In an embodiment, an end of the encapsulation layer 40 may be on the first planarization layer 117. In an embodiment, ends of the opposite electrode 230, the first inorganic layer 310, and the second inorganic layer 320 may be on the upper surface of the first planarization layer 117.

Figure 8:
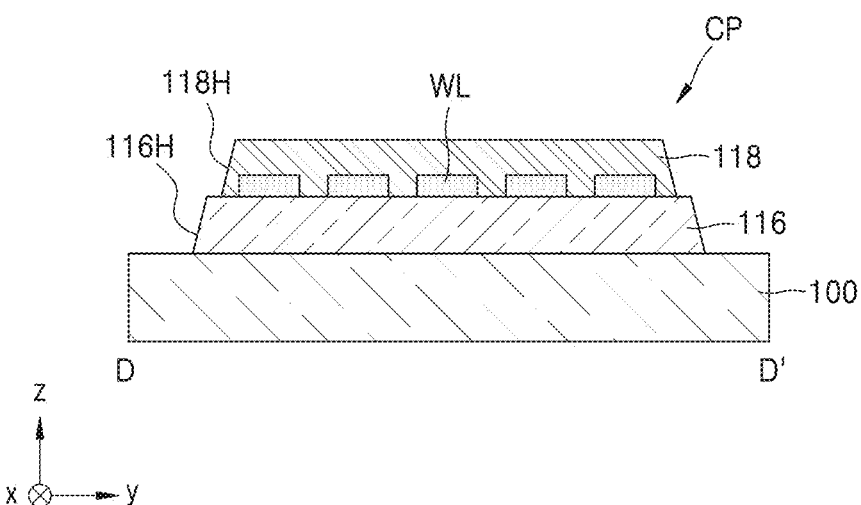
FIG. 8 is a cross-sectional view schematically illustrating a display apparatus according to an embodiment.

FIG. 8 is a cross-sectional view schematically illustrating a display apparatus according to an embodiment. Specifically, FIG. 8 is a cross-sectional view of the display apparatus 1 taken along line D-D' of FIG. 4.

Hereinafter, the stack structure of the connection part CP will be described in detail.

Referring to FIG. 8, the connection part CP may include a substrate 100, a first organic insulating layer 116, a wiring WL, and a second organic insulating layer 118.

In an embodiment, the first organic insulating layer 116 may be on the substrate 100. The first organic insulating layer 116 may include an organic insulating material selected from general-purpose polymer such as PMMA or PS, polymer derivatives having a phenolic group, acrylic polymer, imide polymer, aryl ether polymer, amide polymer, fluorine polymer, p-xylene polymer, vinyl alcohol polymer, and any blend thereof.

A wiring WL may be on the first organic insulating layer 116. The wiring WL may be the same member as the wiring WL described above with reference to FIG. 7. That is, the wiring WL may extend from the display part DP to the connection part CP. Therefore, the wiring WL may be configured to transmit, to the pixel circuit PC arranged in the display part DP, a power supply voltage, a data signal (or a data voltage), a scan signal (or a scan voltage), and an emission control signal (or an emission control voltage).

In an embodiment, the second organic insulating layer 118 may be on the wiring WL. The second organic insulating layer 118 may be formed by a same process as that of the first planarization layer 117 or the second planarization layer 119 described above with reference to FIG. 7. In such an embodiment, the second organic insulating layer 118 may include a same material as that of the first planarization layer 117 or the second planarization layer 119.

In an embodiment, an opposite electrode (see 230 of FIG. 7) may not be on the second organic insulating layer 118 of the connection part CP. However, the disclosure is not limited thereto. Alternatively, the opposite electrode 230 may be on the second organic insulating layer 118 of the connection part CP.

In an embodiment, holes 116H and 118H that at least partially overlap the penetration opening (see POP of FIG. 4) may be defined through the first organic insulating layer 116 and the second organic insulating layer 118, respectively. In such an embodiment, the first organic insulating layer 116 and the second organic insulating layer 118 may not be in the penetration opening POP.

Figure 9:
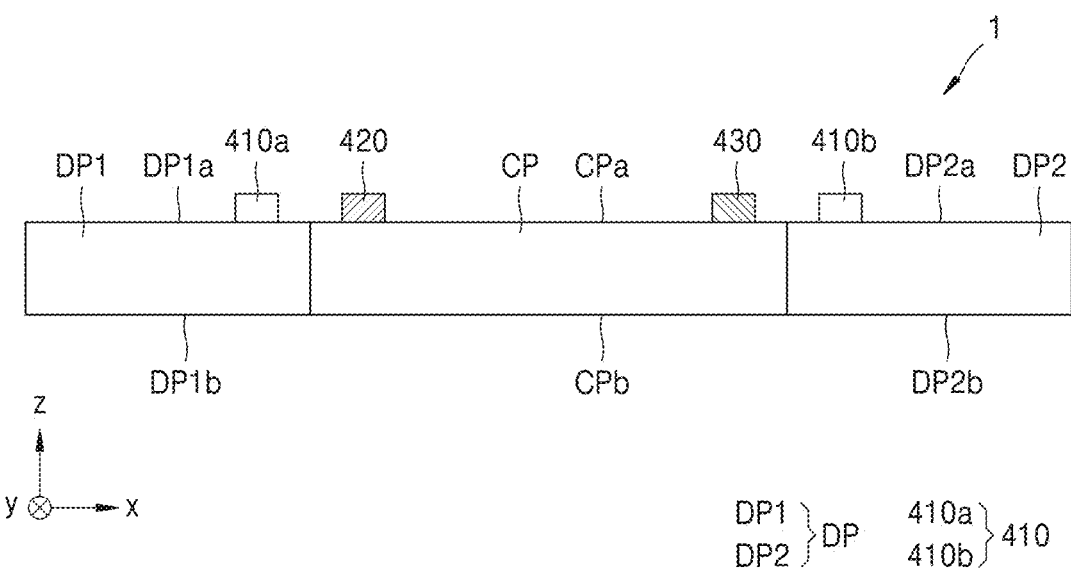
FIG. 9 is a cross-sectional view schematically illustrating a display apparatus according to an embodiment.

FIG. 9 is a cross-sectional view schematically illustrating a display apparatus 1 according to an embodiment. Specifically, FIG. 9 is a cross-sectional view schematically illustrating a display part DP and a connection part CP.

Referring to FIG. 9, the display apparatus 1 may include the display part DP and the connection part CP. The display part DP may include a first display part DP1 and a second display part DP2. The first display part DP1 and the second display part DP2 may be connected to each other by the connection part CP.

When the display panel 10 is stretched and/or contracted, strain may be generated in the connection part CP. When the display panel 10 is stretched in the first direction (e.g., the +x or −x direction) and/or in the second direction (e.g., the +y or −y direction), the shape of the connection part CP may be deformed. Also, the shape of the connection part CP may be deformed not only in the first direction (e.g., the +x or −x direction) and/or in the second direction (e.g., the +y or −y direction), but also in the third direction (e.g., the +z or −z direction) crossing the first direction (e.g., the +x or −x direction) and the second direction (e.g., the +y or −y direction). As described above, as the shape of the connection part CP is three-dimensionally deformed, additional strain may be generated. In this case, distortion and/or lifting may occur in the connection part CP.

In an embodiment, the display apparatus 1 may include a first pattern 410 that overlaps the display part DP and is at a position adjacent to the connection part CP. The first pattern 410 may include a first first pattern 410a and a second first pattern 410b.

The first first pattern 410a may be on an upper surface DP1a of the first display part DP1. The first first pattern 410a may be on the upper surface DP1a of the first display part DP1 adjacent to the connection part CP. The second first pattern 410b may be on an upper surface DP2a of the second display part DP2. In an embodiment, the second first pattern 410b may be on the upper surface DP2a of the second display part DP2 adjacent to the connection part CP. In such an embodiment, the upper surface DP1a of the first display part DP1 may refer to a surface of the first display part DP1 located in the +z direction, and a lower surface DP1b of the first display part DP1 may refer to a surface of the first display part DP1 located in the −z direction. Also, the upper surface DP2a of the second display part DP2 may refer to a surface of the second display part DP2 located in the +z direction, and a lower surface DP2b of the second display part DP2 may refer to a surface of the second display part DP2 located in the −z direction.

Although FIG. 9 illustrates an embodiment where the first first pattern 410a is on the upper surface DP1a of the first display part DP1, the disclosure is not limited thereto. In an alternative embodiment, for example, the first first pattern 410a may be on the lower surface DP1b of the first display part DP1. In an embodiment, the second first pattern 410b may be on the upper surface DP2$a$ of the second display part DP2, but the disclosure is not limited thereto. In an alternative embodiment, for example, the second first pattern 410$b$ may be on the lower surface DP2$b$ of the second display part DP2.

In an embodiment, the first pattern 410 may include an organic material. In an embodiment, for example, the first pattern 410 may include an organic material selected from general-purpose polymer such as PMMA or PS, polymer derivatives having a phenolic group, acrylic polymer, imide polymer, aryl ether polymer, amide polymer, fluorine polymer, p-xylene polymer, vinyl alcohol polymer, and any blend thereof. However, the disclosure is not limited thereto. In an embodiment, for example, the first pattern 410 may include an inorganic material. In an embodiment, for example, the first pattern 410 may include at least one inorganic insulating material selected from silicon oxide (SiO$_x$), silicon nitride (SiN$_x$), silicon oxynitride (SiO$_x$N$_y$), aluminum oxide (Al$_2$O$_3$), titanium oxide (TiO$_2$), tantalum oxide (Ta$_2$O$_5$), hafnium oxide (HfO$_2$), and zinc oxide (ZnO$_x$). Here, zinc oxide (ZnO$_x$) may be ZnO and/or ZnO$_2$.

In an embodiment, the first pattern 410 is provided in the display part DP adjacent to the connection part CP, such that the shape of the connection part CP may be three-dimensionally modified more easily. In such an embodiment, the first pattern 410 is provided in the display part DP adjacent to the connection part CP, such that the three-dimensional deformation of the shape of the connection part CP may be suppressed.

In an embodiment, the display apparatus 1 may include a second pattern 420 that overlaps the connection part CP and is arranged at a position adjacent to the first display part DP1, and a third pattern 430 that overlaps the connection part CP and is arranged at a position adjacent to the second display part DP2.

The second pattern 420 may be on the connection part CP. The second pattern 420 may be on an upper surface CPa of the connection part CP. The second pattern 420 may be on the upper surface CPa of the connection part CP adjacent to the first display part DP1. In an embodiment, the upper surface CPa of the connection part CP may refer to a surface of the connection part CP located in the +z direction, and a lower surface CPb of the connection part CP may refer to a surface of the connection part CP located in the −z direction.

The third pattern 430 may be on the connection part CP. The third pattern 430 may be on the upper surface CPa of the connection part CP. The third pattern 430 may be on the upper surface CPa of the connection part CP adjacent to the second display part DP2.

In an embodiment, the second pattern 420 and the third pattern 430 may include an inorganic material. In an embodiment, for example, the second pattern 420 and the third pattern 430 may include at least one inorganic insulating material selected from silicon oxide (SiO$_x$), silicon nitride (SiN$_x$), silicon oxynitride (SiO$_x$N$_y$), aluminum oxide (Al$_2$O$_3$), titanium oxide (TiO$_2$), tantalum oxide (Ta$_2$O$_5$), hafnium oxide (HfO$_2$), and zinc oxide (ZnO$_x$). Zinc oxide (ZnO$_x$) may be ZnO and/or ZnO2. However, the disclosure is not limited thereto. In an alternative embodiment, for example, the second pattern 420 and the third pattern 430 may include an organic material selected from general-purpose polymer such as PMMA or PS, polymer derivatives having a phenolic group, acrylic polymer, imide polymer, aryl ether polymer, amide polymer, fluorine polymer, p-xylene polymer, vinyl alcohol polymer, and any blend thereof.

In an embodiment, the modulus of the second pattern 420 and the third pattern 430 may be greater than the modulus of the connection part CP. In such an embodiment where the second pattern 420 and the third pattern 430 having a modulus greater than that of the connection part CP are on the upper surface CPa of the connection part CP, the bending resistance of the upper surface CPa of the connection part CP may be increased, and the stretchability of the connection part CP in the −z direction may be improved. Accordingly, in such an embodiment, the connection part CP may be easily deformed in the −z direction.

In an alternative embodiment, the modulus of the second pattern 420 and the third pattern 430 may be less than the modulus of the connection part CP. In such an embodiment where the modulus of the second pattern 420 and the third pattern 430 is less than the modulus of the connection part CP, the second pattern 420 and the third pattern 430 may partially absorb strain generated when the connection part CP is three-dimensionally deformed. When the second pattern 420 and the third pattern 430 having a modulus less than that of the connection part CP are on the upper surface CPa of the connection part CP, the second pattern 420 and the third pattern 430 may absorb the strain generated when the shape of the connection part CP is three-dimensionally deformed. Therefore, the occurrence of distortion and/or lifting in the connection part CP may be prevented or minimized, and the stretchability of the connection part CP in the +z direction may be improved. In such an embodiment, the connection part CP may be easily deformed in the +z direction.

In an alternative embodiment, although not illustrated, the second pattern 420 and the third pattern 430 having a modulus greater than that of the connection part CP may be on the lower surface CPb of the connection part CP. In such an embodiment where the second pattern 420 and the third pattern 430 having a modulus greater than that of the connection part CP are on the lower surface CPb of the connection part CP, the bending resistance of the lower surface CPb of the connection part CP may be increased, and the stretchability of the connection part CP in the +z direction may be improved. In such an embodiment, the connection part CP may be easily deformed in the +z direction.

In an alternative embodiment, although not illustrated, the second pattern 420 and the third pattern 430 having a modulus less than that of the connection part CP may be on the lower surface CPb of the connection part CP. In such an embodiment where the second pattern 420 and the third pattern 430 having a modulus less than that of the connection part CP are on the lower surface CPb of the connection part CP, the second pattern 420 and the third pattern 430 may absorb the strain generated when the shape of the connection part CP is three-dimensionally deformed. Therefore, the occurrence of distortion and/or lifting in the connection part CP may be prevented or minimized, and the stretchability of the connection part CP in the −z direction may be improved. In such an embodiment, the connection part CP may be easily deformed in the −z direction.

Figure 10:
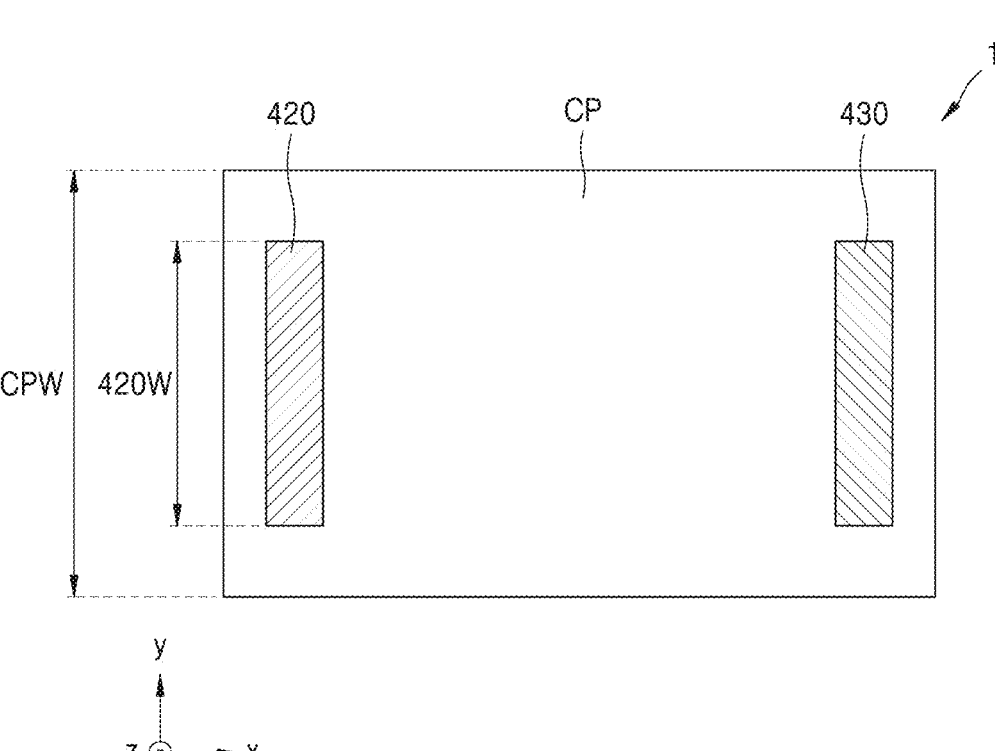
FIG. 10 is a plan view schematically illustrating a display apparatus according to an embodiment.

FIG. 10 is a plan view schematically illustrating a display apparatus 1 according to an embodiment. Specifically, FIG. 10 is a diagram showing the width of the connection part CP, the second pattern 420, and/or the third pattern 430.

Referring to FIG. 10, in an embodiment, a width CPW of the connection part CP may be greater than a width 420W of the second pattern 420. However, the disclosure is not limited thereto. In an alternative embodiment, although not illustrated, the width CPW of the connection part CP may be equal to the width 420W of the second pattern 420. In an embodiment, the width CPW of the connection part CP may be equal to or greater than the width 420W of the second pattern 420.

Figure 11:
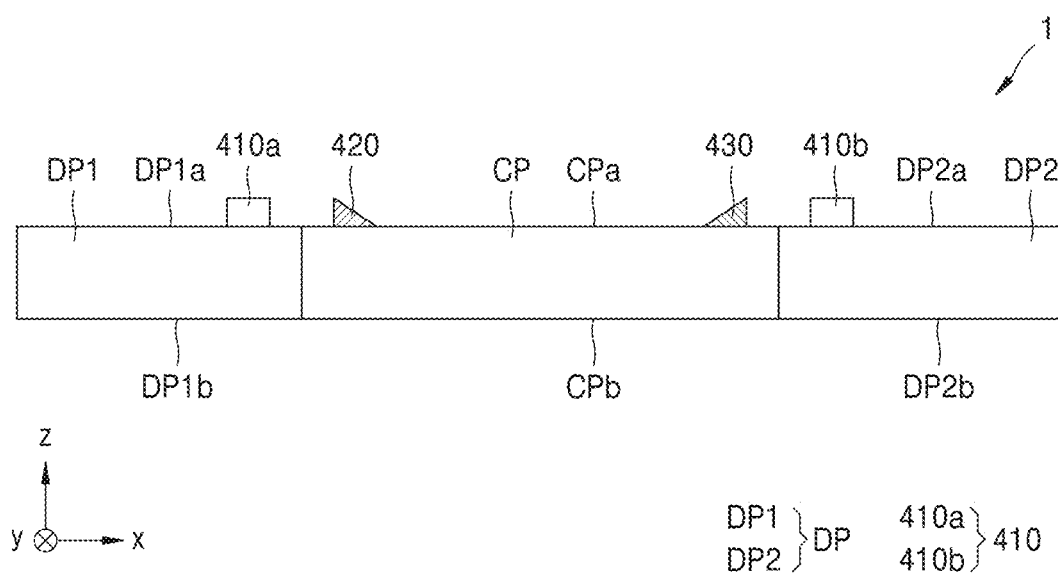
FIG. 11 is a cross-sectional view schematically illustrating a display apparatus according to an embodiment.

FIG. 11 is a cross-sectional view schematically illustrating a display apparatus 1 according to an embodiment. The embodiment of FIG. 11 is substantially the same as the embodiment of FIG. 9 except that a second pattern 420 and a third pattern 430 have a triangular shape. The same or like elements shown in FIG. 11 have been labeled with the same reference characters as used above to describe the embodiment of the display apparatus shown in FIG. 9, and any repetitive detailed description thereof will hereinafter be omitted or simplified.

Referring to FIG. 11, in an embodiment, the second pattern 420 and the third pattern 430 may be on a connection part CP. The second pattern 420 and the third pattern 430 may be on an upper surface CPa of the connection part CP. The second pattern 420 may be located adjacent to the first display part DP1, and the third pattern 430 may be located adjacent to the second display part DP2.

In an embodiment, the second pattern 420 and the third pattern 430 may have a triangular shape in a cross-sectional view. In an embodiment, for example, the second pattern 420 and the third pattern 430 may have a right-angled triangular shape in a cross-sectional view. However, the disclosure is not limited thereto. In an embodiment, for example, as illustrated in FIG. 9, the second pattern 420 and the third pattern 430 may have a rectangular shape in a cross-sectional view. Alternatively, the second pattern 420 and the third pattern 430 may have a semicircular shape, an elliptical shape, or a polygonal shape in a cross-sectional view.

Figure 12:
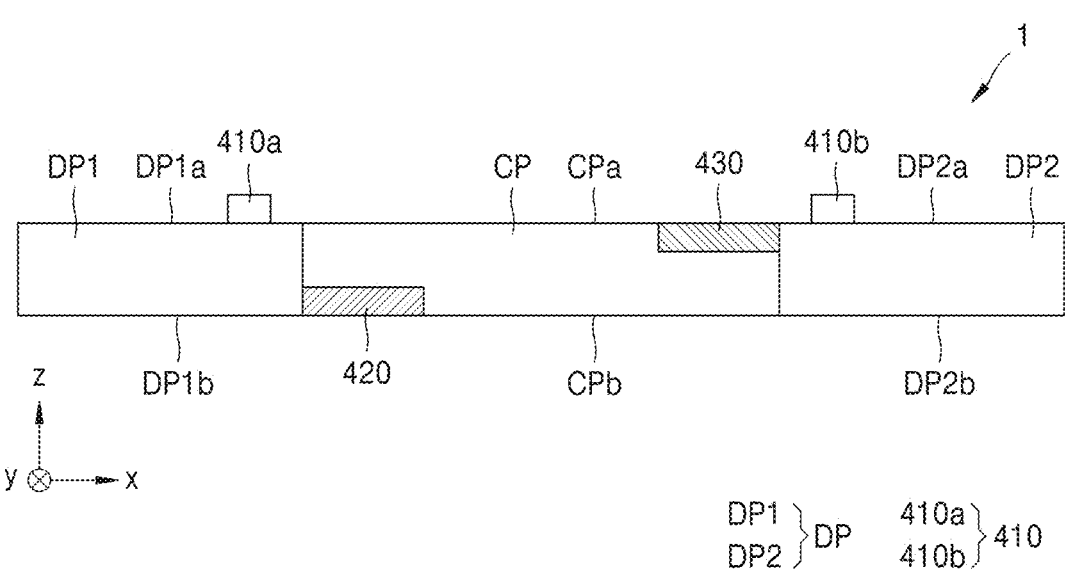
FIG. 12 is a cross-sectional view schematically illustrating a display apparatus according to an embodiment.

FIG. 12 is a cross-sectional view schematically illustrating a display apparatus 1 according to an embodiment. The embodiment of FIG. 12 is substantially the same as the embodiment of FIG. 9 except that at least one of the second pattern 420 and the third pattern 430 is recessed into the connection part CP. The same or like elements shown in FIG. 12 have been labeled with the same reference characters as used above to describe the embodiment of the display apparatus shown in FIG. 9, and any repetitive detailed description thereof will hereinafter be omitted or simplified.

Referring to FIG. 12, the display apparatus 1 may include a display part DP and a connection part CP. The display part DP may include a first display part DP1 and a second display part DP2. The first display part DP1 and the second display part DP2 may be connected to each other by the connection part CP.

The display apparatus 1 may include a second pattern 420 and a third pattern 430. The second pattern 420 may be located adjacent to the first display part DP1, and the third pattern 430 may be located adjacent to the second display part DP2.

In an embodiment, the second pattern 420 and the third pattern 430 may overlap the connection part CP. In an embodiment, at least one of the second pattern 420 and the third pattern 430 may be recessed into the connection part CP. In such an embodiment, at least one of the second pattern 420 and the third pattern 430 may be disposed in a recessed portion of the connection part CP, which is recessed inward from a surface of the connection part CP. In an embodiment, the second pattern 420 may be recessed into the connection part CP adjacent to a lower surface CPb of the connection part CP. In an embodiment, for example, the second pattern 420 may be recessed into the connection part CP in the +z direction from the lower surface CPb of the connection part CP. Also, in an embodiment, the third pattern 430 may be recessed into the connection part CP adjacent to an upper surface CPa of the connection part CP. In an embodiment, for example, the third pattern 430 may be recessed into the connection part CP in the −z direction from the upper surface CPa of the connection part CP. However, the disclosure is not limited thereto. In an alternative embodiment, for example, the second pattern 420 may be recessed into the connection part CP adjacent to the upper surface CPa of the connection part CP, or the third pattern 430 may be recessed into the connection part CP adjacent to the lower surface CPb of the connection part CP. Alternatively, both the second pattern 420 and the third pattern 430 may be recessed into the connection part CP adjacent to the upper surface CPa of the connection part CP, and both the second pattern 420 and the third pattern 430 may be recessed into the connection part CP adjacent to the lower surface CPb of the connection part CP.

Figure 13:
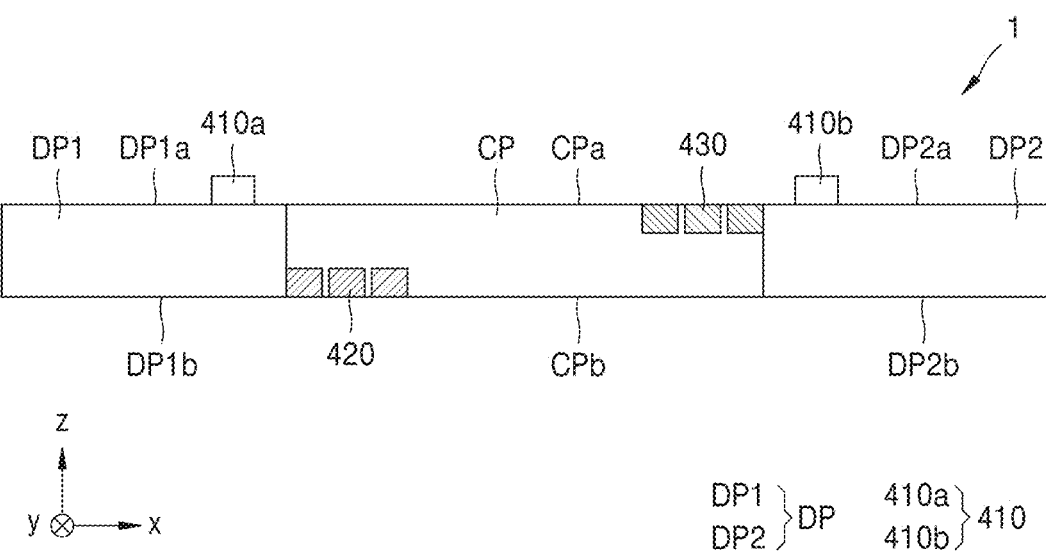
FIG. 13 is a cross-sectional view schematically illustrating a display apparatus according to an embodiment.

FIG. 13 is a cross-sectional view schematically illustrating a display apparatus 1 according to an embodiment. The embodiment of FIG. 13 is substantially the same as the embodiment of FIG. 12 except that each of a second pattern 420 and a third pattern 430 includes a plurality of patterns. The same or like elements shown in FIG. 13 have been labeled with the same reference characters as used above to describe the embodiment of the display apparatus shown in FIG. 12, and any repetitive detailed description thereof will hereinafter be omitted or simplified.

Referring to FIG. 13, an embodiment of the display apparatus 1 may include the second pattern 420 and the third pattern 430. The second pattern 420 and the third pattern 430 may overlap the connection part CP. The second pattern 420 may be located adjacent to the first display part DP1, and the third pattern 430 may be located adjacent to the second display part DP2.

In an embodiment, a plurality of second patterns 420 may be provided. In such an embodiment, a plurality of third patterns 430 may be provided. Although FIG. 13 illustrates an embodiment where three second patterns 420 and three third pattern 430 are provided, the disclosure is not limited thereto. The number of second patterns 420 and the number of third patterns 430 may variously change. In an embodiment, for example, two or four second patterns 420 and two or four third patterns 430 may be provided. In an embodiment, two second patterns 420 may be provided, and three third patterns 430 may be provided.

In an embodiment, the second patterns 420 may be recessed into the connection part CP adjacent to the lower surface CPb of the connection part CP. In an embodiment, for example, the second patterns 420 may be recessed into the connection part CP in the +z direction from the lower surface CPb of the connection part CP. However, the disclosure is not limited thereto.

In an embodiment, the third patterns 430 may be recessed into the connection part CP adjacent to an upper surface CPa of the connection part CP. In an embodiment, for example, the third patterns 430 may be recessed into the connection part CP in the −z direction from the upper surface CPa of the connection part CP. However, the disclosure is not limited thereto.

Figure 14:
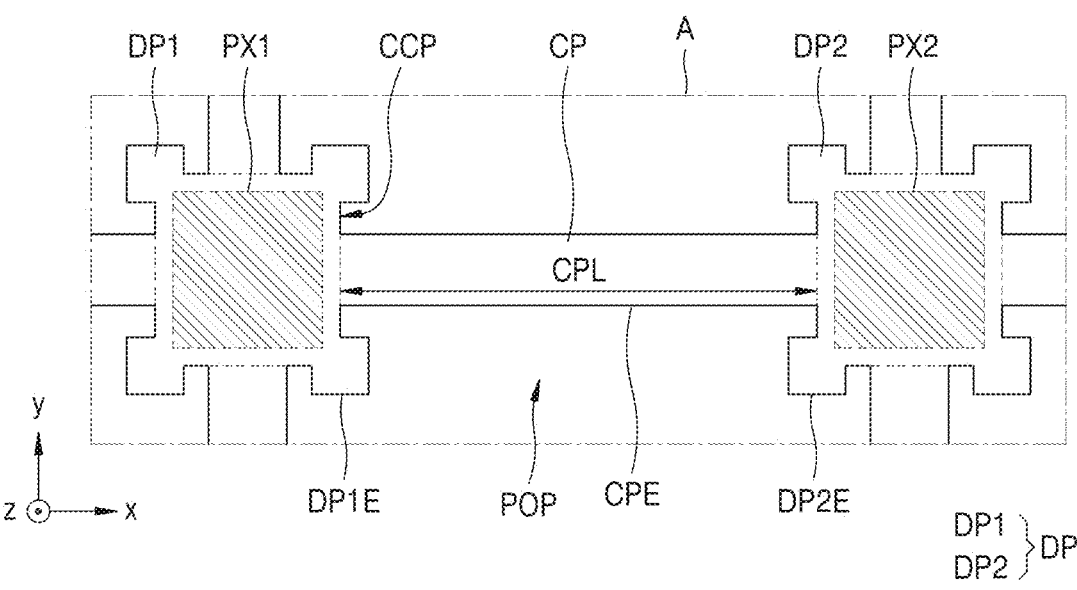
FIG. 14 is a plan view schematically illustrating a display apparatus according to an embodiment.

FIG. 14 is a plan view schematically illustrating a display apparatus according to an embodiment. The embodiment of FIG. 14 is substantially the same as the embodiment of FIG. 4 except that concave parts CCP are provided at edges of a display part DP. The same or like elements shown in FIG. 14 have been labeled with the same reference characters as used above to describe the embodiment of the display apparatus shown in FIG. 4, and any repetitive detailed description thereof will hereinafter be omitted or simplified.

Referring to FIG. 14, an embodiment of the display apparatus may include a display part DP and a connection part CP. The display part DP may include a first display part DP1 and a second display part DP2. In an embodiment, the display apparatus may include a plurality of first display parts DP1 and a plurality of second display parts DP2. In an embodiment, the display apparatus may include a plurality of connection parts CP.

A penetration opening POP may be defined in the display panel 10. The penetration opening POP may pass or extend through the display panel 10. Therefore, the penetration opening POP may be an area in which elements of the display panel 10 are not arranged. The display panel 10 may include a plurality of penetration openings POP. Therefore, the flexibility of the display panel 10 may be improved.

In an embodiment, an edge DP1 E of the first display part DP1 may include a plurality of concave parts CCP recessed into the first display part DP1. In such an embodiment, the concave part CCP may be the edge DP1 E of the first display part DP1 that is recessed into the first display part DP1. In such an embodiment, the inward direction of the first display part DP1 may be a direction from the edge DP1 E of the first display part DP1 to the inside of the first display part DP1. In an embodiment, for example, the edge DP1E of the first display part DP1 may be recessed in the first direction (e.g., the +x or −x direction) and/or the second direction (e.g., the +y or −y direction).

In an embodiment, an edge DP2E of the second display part DP2 may include a plurality of concave parts CCP recessed into the second display part DP2. In such an embodiment, the concave part CCP may be the edge DP2E of the second display part DP2 that is recessed into the second display part DP2. In such an embodiment, the inward direction of the second display part DP2 may be a direction from the edge DP2E of the second display part DP2 to the inside of the second display part DP2. In an embodiment, for example, the edge DP2E of the second display part DP2 may be recessed in the first direction (e.g., the +x or −x direction) and/or the second direction (e.g., the +y or −y direction).

Although FIG. 14 illustrates an embodiment where the concave parts CCP have a same shape as each other, the disclosure is not limited thereto. In an alternative embodiment, for example, the shape of one of the concave parts CCP may be different from the shape of another of the concave parts CCP. Also, although FIG. 14 illustrates an embodiment where the concave parts CCP have a rectangular shape, the concave parts CCP may have a polygonal shape such as a triangular shape or a pentagonal shape. Alternatively, the concave parts CCP may have a curved shape.

In an embodiment, where the edge DP1E of the first display part DP1 and the edge DP2E of the second display part DP2 apart from each other in the first direction (e.g., the x or −x direction) have concave parts CCP, respectively, the length of the connection part CP between the first display part DP1 and the second display part DP2 in the first direction (e.g., the +x or −x direction) may increase. When the length of the connection part CP between the first display part DP1 and the second display part DP2 increases, strain and/or stress applied to the connection part CP may be reduced. In such an embodiment, because the first display part DP1 and the second display part DP2 include the concave parts CCP, respectively, the length of the connection part CP between the first display part DP1 and the second display part DP2 increases, and strain and/or stress applied to the connection part CP may be reduced. Accordingly, the occurrence of distortion and/or lifting in the connection part CP may be prevented or minimized.

In an embodiment, the connection part CP may have a length CPL of about 1 micrometer (μm) to about 10 millimeters (mm) in the first direction (e.g., the +x or −x direction). If the length CPL of the connection part CP is less than 1 μm, strain generated during the three-dimensional deformation may be increased, causing distortion and/or lifting in the connection part CP. On the other hand, if the length CPL of the connection part CP is greater than 10 mm, the number of display parts DP included in the display panel 10 is reduced, and the number of pixels in the display panel 10 is reduced, and thus, the resolution of the display apparatus may be deteriorated. Therefore, in an embodiment where the length CPL of the connection part CP is in a range of about 1 μm to about 10 mm, strain and/or stress applied to the connection part CP may be reduced, and the resolution of the display apparatus may be increased.

Figure 15:
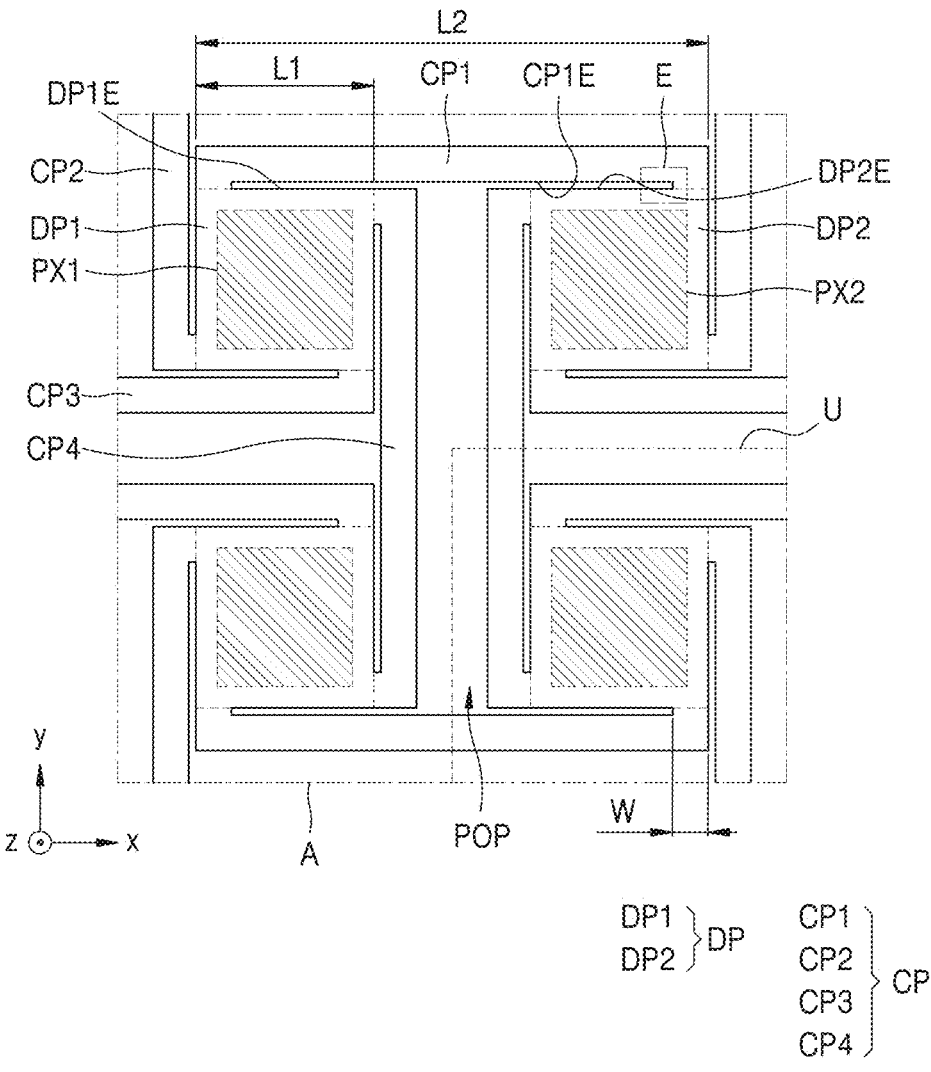
FIG. 15 is a plan view schematically illustrating a display apparatus according to an embodiment.

FIG. 15 is a plan view schematically illustrating a display apparatus according to an embodiment. FIG. 15 is an enlarged view of region A of FIG. 2.

Referring to FIG. 15, an embodiment of the display apparatus may include a display part DP and a connection part CP. The display part DP may include a first display part DP1 and a second display part DP2. A first pixel PX1 may be in the first display part DP1, and a second pixel PX2 may be in the second display part DP2. The connection part CP may include a first connection part CP1, a second connection part CP2, a third connection part CP3, and a fourth connection part CP4.

A plurality of display parts DP may be apart from each other in the first direction (e.g., the +x or −x direction) and/or the second direction (e.g., the +y or −y direction). In an embodiment, for example, the first display part DP1 and the second display part DP2 may be apart from each other in the first direction (e.g., the +x or −x direction) and/or the second direction (e.g., the +y or −y direction).

The connection part CP may extend between the adjacent display parts DP. In an embodiment, each of the display parts DP may be connected to four connection parts CP. The four connection parts CP connected to one display part DP may extend in different directions from each other, and each of the four connection parts CP may be connected to the other display part DP adjacent to the one display part DP described above.

In an embodiment, the first connection part CP1 may extend from the first display part DP1 to the second display part DP2. Therefore, the first display part DP1 and the second display part DP2 may be connected to each other by the first connection part CP1, and the first display part DP1, the second display part DP2, and the first connection part CP1 may be integral with each other.

A penetration opening POP may be defined in the display panel 10. The first display part DP1 and the second display part DP2 may be apart from each other with the penetration opening POP therebetween. The penetration opening POP may pass through the display panel 10. Therefore, elements of the display panel 10 may not be arranged in the penetration opening POP.

In an embodiment, at least a portion of the penetration opening POP may be defined by edges of the display parts DP and edges of the connection parts CP. In an embodiment, for example, at least a portion of the penetration opening POP may be defined as an edge DP1E of the first display part DP1, an edge DP2E of the second display part DP2, and an edge CP1E of the first connection part CP1.

One display part DP and a portion of the connection parts CP extending therefrom may be defined as one basic unit U. The basic unit U may be repeatedly arranged in the first direction (e.g., the +x or −x direction) and the second direction (e.g., the +y or −y direction), and it may be understood that the display panel (see 10 of FIG. 2) has a structure in which the basic units U repeatedly arranged are connected to each other. Two basic units U adjacent to each other may be symmetrical to each other. In an embodiment, for example, as shown in FIG. 15, two basic units U adjacent to each other in a horizontal direction may be bilaterally symmetrical with respect to an axis of symmetry located therebetween and parallel to the second direction (e.g., the +y or −y direction). In such an embodiment, in FIG. 15, two basic units U adjacent to each other in a vertical direction may be vertically symmetrical with respect to an axis of symmetry located therebetween and parallel to the first direction (e.g., the +x or −x direction).

In an embodiment, the ratio of the length L1 of the display part DP to the length L2 of the connection part CP in the first direction (e.g., the +x or −x direction) may be about 100:1 to about 1:100. In an embodiment, the ratio of the length L1 of the display part DP to the length L2 of the connection part CP in the first direction (e.g., the +x or −x direction) may be equal to the ratio of the length L1 of the display part DP to the length L2 of the connection part CP in the second direction (e.g., the +y or −y direction). However, the disclosure is not limited thereto. In an alternative embodiment, for example, the ratio of the length L1 of the display part DP to the length L2 of the connection part CP in the first direction (e.g., the +x or −x direction) may be different from the ratio of the length L1 of the display part DP to the length L2 of the connection part CP in the second direction (e.g., the +y or −y direction).

Although not illustrated, each of the first pixel PX1 and the second pixel PX2 may include a red sub-pixel (see Pr of FIG. 4), a green sub-pixel (see Pg of FIG. 4), and a blue sub-pixel (see Pb of FIG. 4). The red sub-pixel Pr, the green sub-pixel Pg, and the blue sub-pixel Pb may emit red light, green light, and blue light, respectively. Alternatively, each of the first pixel PX1 and the second pixel PX2 may include a red sub-pixel Pr, a green sub-pixel Pg, a blue sub-pixel Pb, and a white sub-pixel. The red sub-pixel Pr, the green sub-pixel Pg, the blue sub-pixel Pb, and the white sub-pixel may emit red light, green light, blue light, and white light, respectively.

In an embodiment, if a width W of a connection portion where the connection part CP and the display part DP are connected to each other is less than 1 μm, the width W of the connection portion may be too narrow. Thus, a portion of a wiring (see WL of FIG. 7) in the connection portion may be exposed, and the width of the wiring WL decreases, so that conductivity may be reduced and the wiring WL may be disconnected. Therefore, in an embodiment, the width W of the connection portion where the connection part CP and the display part DP are connected to each other may be 1 μm or more.

FIGS. 16A to 16E are plan views schematically illustrating a display apparatus according to an embodiment. Specifically, FIGS. 16A to 16E are enlarged views of region E of FIG. 15.

Referring to FIGS. 16A to 16E, the edge CP1E of the first connection part CP1 and the edge DP2E of the second display part DP2 at a portion where the first connection part CP1 and the second display part DP2 meet may have a straight-line shape or a curved shape.

Figure 16A:
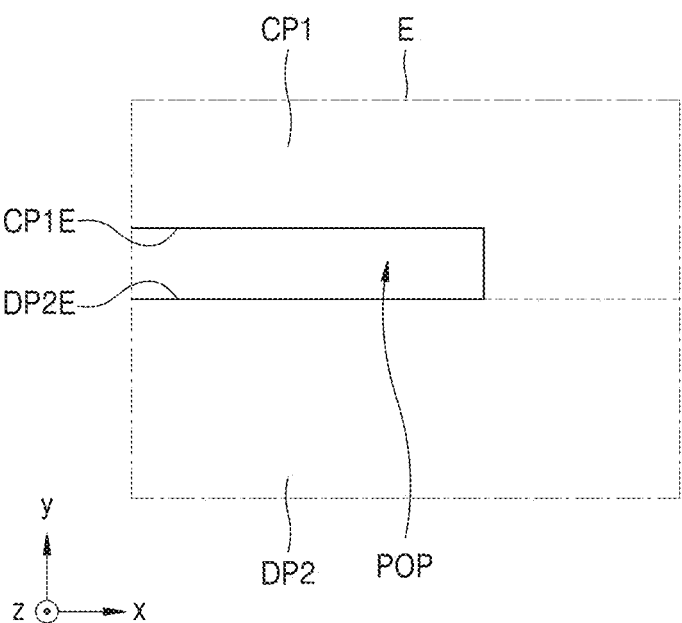
FIGS. 16A to 16E are plan views schematically illustrating a display apparatus according to an embodiment.

In an embodiment, as illustrated in FIG. 16A, the edge CP1E of the first connection part CP1 and/or the edge DP2E of the second display part DP2 at a portion where the first connection part CP1 and the second display part DP2 meet may have a straight-line shape. In such an embodiment, an angle between the edge CP1E of the first connection part CP1 and/or the edge DP2E of the second display part DP2 may be a right angle.

Figure 16B:
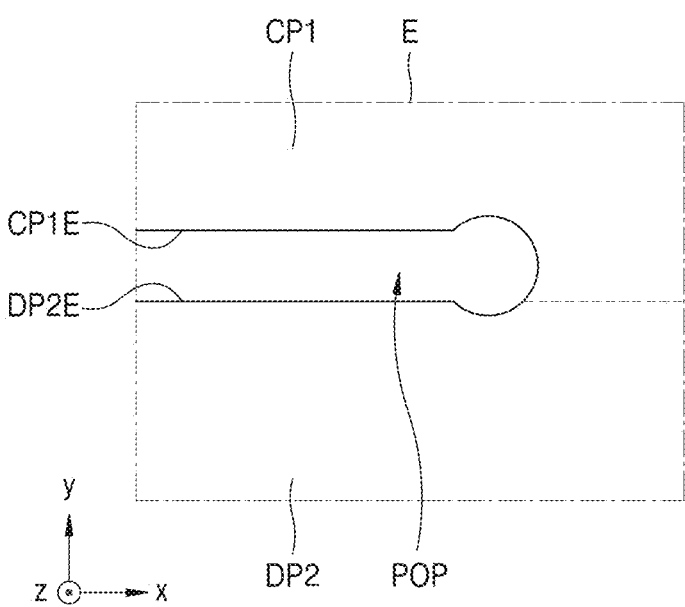

In an embodiment, as illustrated in FIG. 16B, the edge CP1E of the first connection part CP1 and/or the edge DP2E of the second display part DP2 at a portion where the first connection part CP1 and the second display part DP2 meet may have a curved shape. In an embodiment, for example, the edge CP1E of the first connection part CP1 and/or the edge DP2E of the second display part DP2 at a portion where the first connection part CP1 and the second display part DP2 meet may have a curved shape having a curvature of about 1 mm or less.

Figure 16C:
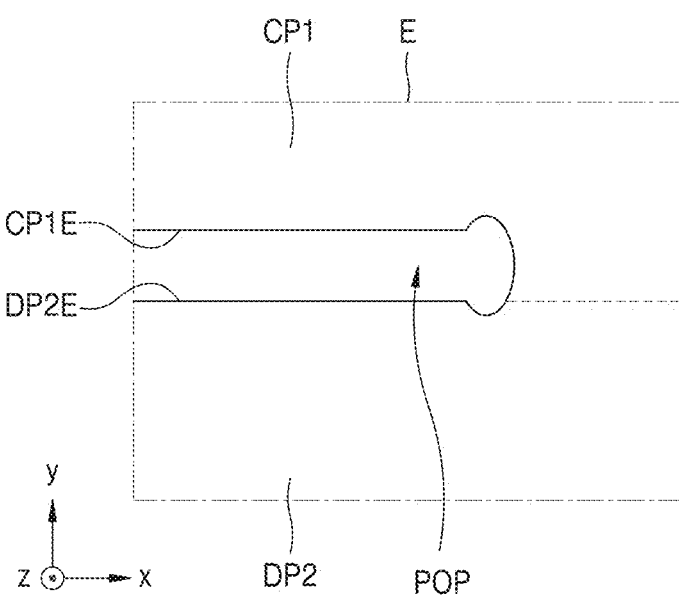

In an embodiment, as illustrated in FIG. 16C, the edge CP1E of the first connection part CP1 and/or the edge DP2E of the second display part DP2 at a portion where the first connection part CP1 and the second display part DP2 meet may have a shape in which two or more curves having different curvatures from each other are connected to each other.

Figure 16D:
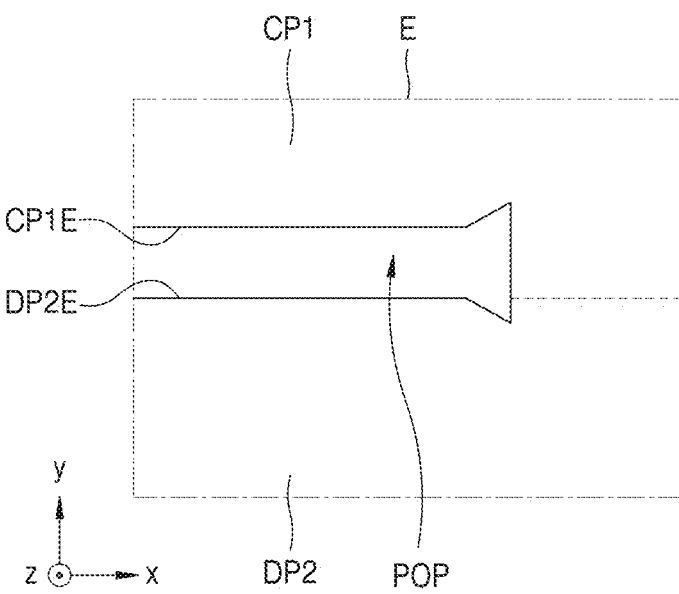

In an embodiment, as illustrated in FIG. 16D, the edge CP1E of the first connection part CP1 and/or the edge DP2E of the second display part DP2 at a portion where the first connection part CP1 and the second display part DP2 meet may have an angled polygonal shape. In an embodiment, for example, a portion of the edge CP1E of the first connection part CP1 and/or the edge DP2E of the second display part DP2 may have a shape that is concave into the first connection part CP1 and/or the second display part DP2.

Figure 16E:
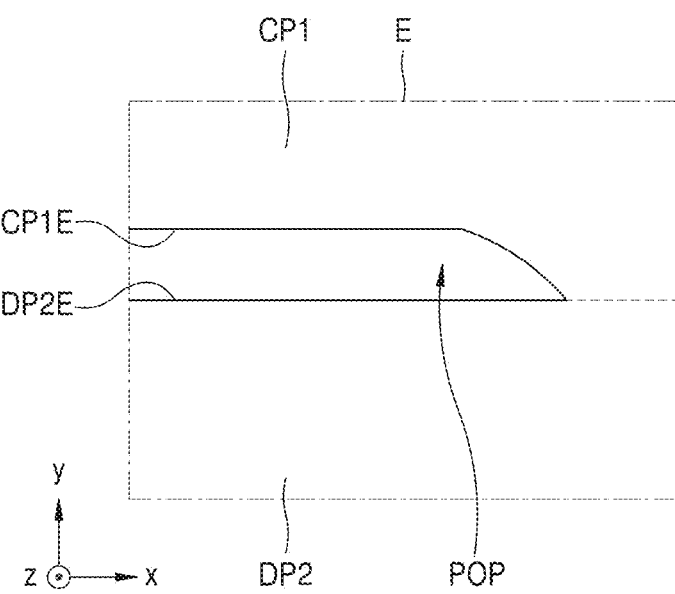

As illustrated in FIG. 16E, the edge CP1E of the first connection part CP1 and/or the edge DP2E of the second display part DP2 at a portion where the first connection part CP1 and the second display part DP2 meet may have a curved shape. For example, the edge CP1E of the first connection part CP1 and/or the edge DP2E of the second display part DP2 at a portion where the first connection part CP1 and the second display part DP2 meet may have a gradual curvature.

In an embodiment where the edge CP1E of the first connection part CP1 and/or the edge DP2E of the second display part DP2 at a portion where the first connection part CP1 and the second display part DP2 meet has a curved shape having a certain curvature, or has a straight-line shape including a portion that is concave into the first connection part CP1 and/or the second display part DP2, concentration of strain at the portion where the first connection part CP1 and the second display part DP2 meet may be prevented or minimized, and the stretchability of the first connection part CP1 may be improved. In such an embodiment, the shape of the first connection part CP1 may be three-dimensionally modified more easily.

Figure 17A:
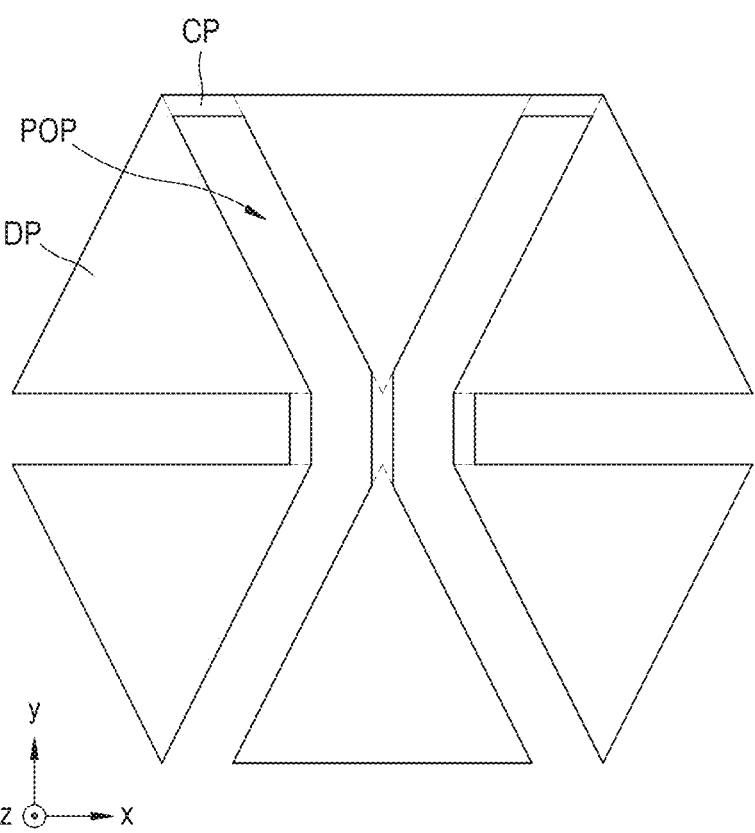
FIGS. 17A and 17B are plan views schematically illustrating a display apparatus according to an embodiment.
Figure 17B:
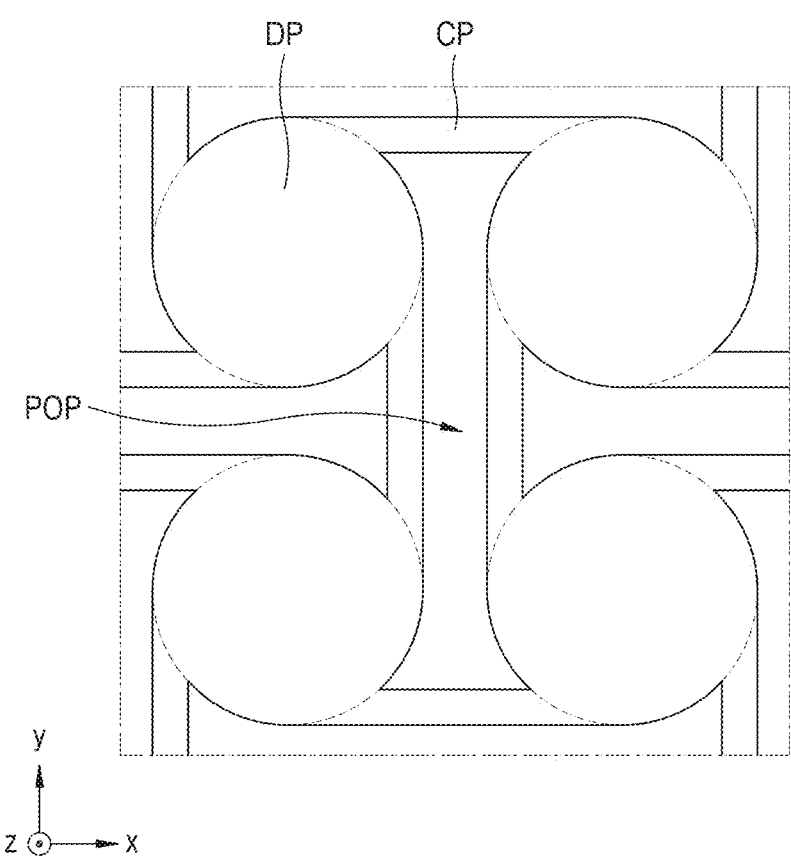

FIGS. 17A and 17B are plan views schematically illustrating a display apparatus according to an embodiment. The embodiments of FIGS. 17A and 17B is substantially the same as the embodiment of FIG. 15 except that a display part DP has a triangular shape or a circular shape, respectively. The same or like elements shown in FIGS. 17A and 17B have been labeled with the same reference characters as used above to describe the embodiment of the display apparatus shown in FIG. 15, and any repetitive detailed description thereof will hereinafter be omitted or simplified.

Referring to FIG. 17A, an embodiment of the display part DP may have a triangular shape. Alternatively, although not illustrated, the display part DP may have a polygonal shape such as a pentagonal shape or a hexagonal shape. In an alternative embodiment, referring to FIG. 17B, the display part DP may have a circular shape. Alternatively, although not illustrated, the display part DP may have an elliptical shape or a semicircular shape.

FIGS. 18A to 18D are plan views schematically illustrating a display apparatus according to an embodiment. In such an embodiment, although the first pattern 410, the second pattern 420, and the third pattern 430 described above with reference to FIGS. 9 to 13 may be on the display apparatus of FIGS. 18A to 18D, the first pattern 410, the second pattern 420, and the third pattern 430 are omitted from FIGS. 18A to 18D for convenience of illustration.

Referring to FIGS. 18A to 18D, an embodiment of the display apparatus may include a display part DP and a connection part CP. The display part DP may include a first display part DP1 and a second display part DP2. The first display part DP1 and the second display part DP2 may be apart from each other in the first direction (e.g., the +x or −x direction). However, the disclosure is not limited thereto. In an embodiment, for example, the first display part DP1 and the second display part DP2 may be apart from each other in the first direction (e.g., the +x or −x direction) and/or the second direction (e.g., the +y or −y direction).

The connection part CP may be between the first display part DP1 and the second display part DP2. The connection part CP may connect the first display part DP1 to the second display part DP2.

In an embodiment, the connection part CP may include a first part CPa adjacent to the first display part DP1, a second part CPb adjacent to the second display part DP2, and a third part CPc between the first part CPa and the second part CPb. In an embodiment, for example, the third part CPc may correspond to a central portion of the connection part CP, and the first part CPa and the second part CPb may correspond to an outer portion of the connection part CP. In such an embodiment, the first part CPa, the second part CPb, and the third part CPc may be integral with each other.

In an embodiment, the connection part CP may have a straight-line shape or a curved shape to prevent or minimize strain concentration.

Figure 18A:
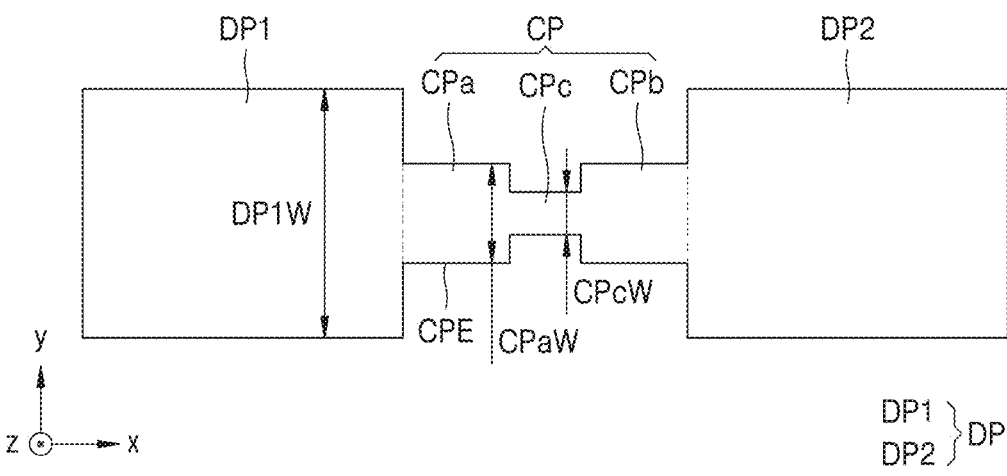
FIGS. 18A to 18D are plan views schematically illustrating a display apparatus according to an embodiment.

Referring to FIG. 18A, a width CPaW of the first part CPa may be different from a width CPcW of the third part CPc. In an embodiment, for example, the width CPaW of the first part CPa may be greater than the width CPcW of the third part CPc. In such an embodiment, the width of the central portion of the connection part CP may be less than the width of the outer portion of the connection part CP adjacent to the display part DP. In an embodiment, the width of the central portion of the connection part CP is less than the width of the outer portion of the connection part CP adjacent to the display part DP, such that the central portion of the connection part CP may be three-dimensionally deformed more easily than the outer portion of the connection part CP adjacent to the display part DP. In such an embodiment, the width of the second part CPb may be equal to or similar to the width CPaW of the first part CPa.

In an embodiment, the edge CPE of the connection part CP may have a straight-line shape. In an embodiment, the edge CPE of the connection part CP may have a shape in which the third part CPc of the connection part CP is concave in the second direction (e.g., the +y or −y direction).

In an embodiment, a maximum width of the connection part CP (e.g., the width CPaW of the first part CPa) may be less than a width DP1W of the first display part DP1. However, the disclosure is not limited thereto. In an embodiment, for example, the maximum width of the connection part CP (e.g., the width CPaW of the first part CPa) may be equal to the width DP1W of the first display part DP1. In such an embodiment, the maximum width of the connection part CP (e.g., the width CPaW of the first part CPa) may be equal to or less than the width DP1W of the first display part DP1.

Figure 18B:
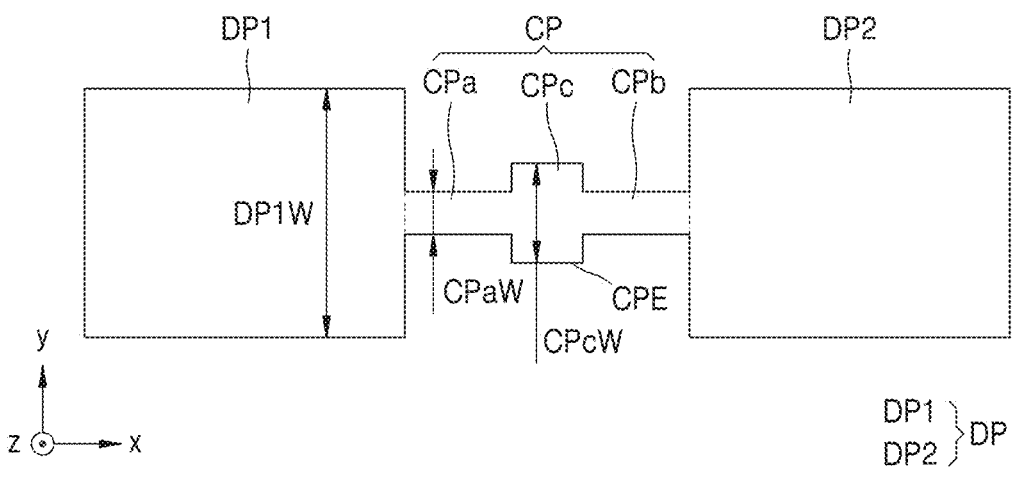

Referring to FIG. 18B, in an embodiment, a width CPaW of the first part CPa may be different from a width CPcW of the third part CPc. In an embodiment, for example, the width CPaW of the first part CPa may be less than the width CPcW of the third part CPc. In such an embodiment, the width of the central portion of the connection part CP may be greater than the width of the outer portion of the connection part CP adjacent to the display part DP. In such an embodiment where the width of the central portion of the connection part CP is greater than the width of the outer portion of the connection part CP adjacent to the display part DP, the outer portion of the connection part CP adjacent to the display part DP may be three-dimensionally modified more easily than the central portion of the connection part CP. In such an embodiment, the width of the second part CPb may be equal to or similar to the width CPaW of the first part CPa.

In an embodiment, the edge CPE of the connection part CP may have a straight-line shape. In an embodiment, the edge CPE of the connection part CP may have a shape in which the third part CPc of the connection part CP is convex in the second direction (e.g., the +y or −y direction).

In an embodiment, a maximum width of the connection part CP (e.g., the width CPcW of the third part CPc) may be less than a width DP1W of the first display part DP1. However, the disclosure is not limited thereto. In an embodiment, for example, the maximum width of the connection part CP (e.g., the width CPcW of the third part CPc) may be equal to the width DP1W of the first display part DP1. In such an embodiment, the maximum width of the connection part CP (e.g., the width CPcW of the third part CPc) may be equal to or less than the width DP1W of the first display part DP1.

Figure 18C:
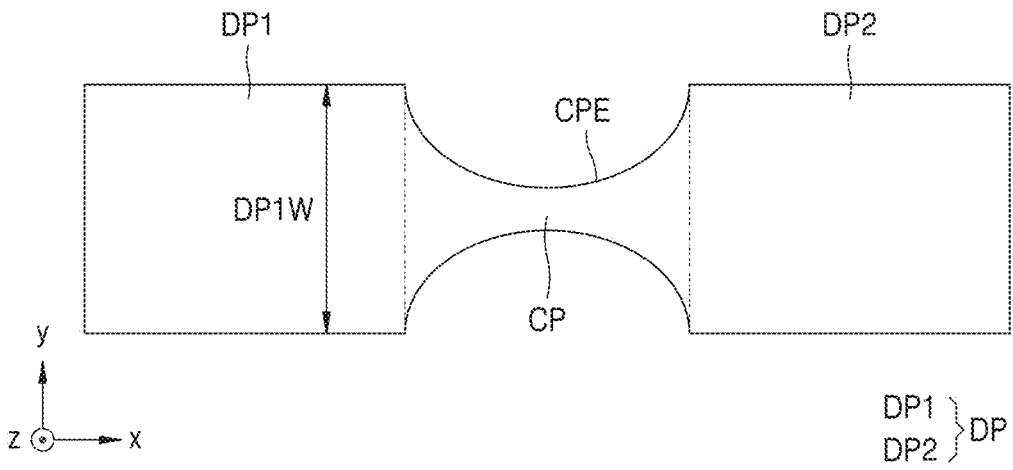

Referring to FIG. 18C, in an embodiment, the width of the connection part CP may gradually increase from the central portion of the connection part CP toward the outer portion of the connection part CP adjacent to the first display part DP1. In an embodiment, the width of the connection part CP may gradually increase from the central portion of the connection part CP toward the outer portion of the connection part CP adjacent to the second display part DP2. In such an embodiment, the width of the connection part CP may gradually increase from the central portion of the connection part CP toward the outer portion of the connection part CP adjacent to the first display part DP1 and the second display part DP2. Therefore, the width of the connection part CP may be least at the central portion of the connection part CP, and may be greatest at the outer portion of the connection part CP adjacent to the first display part DP1 and the second display part DP2. In such an embodiment where the width of the connection part CP gradually increases from the central portion of the connection part CP toward the outer portion of the connection part CP adjacent to the first display part DP1 and the second display part DP2, the central portion of the connection part CP may be three-dimensionally modified more easily than the outer portion of the connection part CP.

In an embodiment, the edge CPE of the connection part CP may have a curved shape. In an embodiment, the edge CPE of the connection part CP may have a shape in which the central portion of the connection part CP is concave in the second direction (e.g., the +y or −y direction).

In an embodiment, a maximum width of the connection part CP (e.g., the width of the outer portion of the connection part CP) may be equal to the width DP1W of the first display part DP1. However, the disclosure is not limited thereto. In an embodiment, for example, the maximum width of the connection part CP (e.g., the width of the outer portion of the connection part CP) may be less than the width DP1W of the first display part DP1. In such an embodiment, the maximum width of the connection part CP (e.g., the width of the outer portion of the connection part CP) may be equal to or less than the width DP1W of the first display part DP1.

Figure 18D:
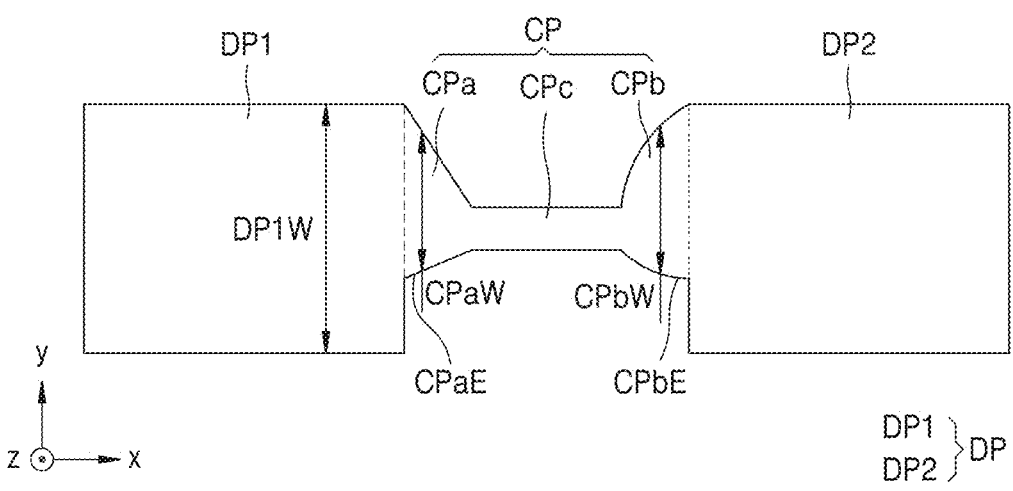

Referring to FIG. 18D, in an embodiment, the width CPaW of the first part CPa may gradually decrease from the first display part DP1 toward the third part CPc. In such an embodiment, the maximum width of the first part CPa may be the width of the first part CPa closest to the first display part DP1. In such an embodiment, the minimum width of the first part CPa may be the width of the first part CPa closest to the third part CPc.

In an embodiment, the width CPbW of the second part CPb may gradually decrease from the second display part DP2 toward the third part CPc. In such an embodiment, the maximum width of the second part CPb may be the width of the second part CPb closest to the second display part DP2. In an embodiment, the minimum width of the second part CPb may be the width of the second part CPb closest to the third part CPc.

In an embodiment, the minimum width of the connection part CP may be the width of the third part CPc. In such an embodiment, the width of the central portion of the connection part CP may be less than the width of the outer portion of the connection part CP adjacent to the display part DP. In an embodiment, where the width of the central portion of the connection part CP is less than the width of the outer portion of the connection part CP adjacent to the display part DP, the central portion of the connection part CP may be three-dimensionally deformed more easily than the outer portion of the connection part CP adjacent to the display part DP.

In an embodiment, the edge CPE of the connection part CP may have a straight-line shape or a curved shape. In an embodiment, for example, the edge CPaE of the first part CPa may have a straight-line shape, and the edge CPbE of the second part CPb may have a curved shape.

In an embodiment, the maximum width of the connection part CP (e.g., the width CPaW of the first part CPa) may be less than the width DP1W of the first display part DP1. However, the disclosure is not limited thereto. In an embodiment, for example, the maximum width of the connection part CP (e.g., the width CPaW of the first part CPa) may be equal to the width DP1W of the first display part DP1. In such an embodiment, the maximum width of the connection part CP (e.g., the width CPaW of the first part CPa) may be equal to or less than the width DP1W of the first display part DP1.

FIGS. 19A to 19D are plan views schematically illustrating a display apparatus according to an embodiment. In such an embodiment, although the first pattern 410, the second pattern 420, and the third pattern 430 described above with reference to FIGS. 9 to 13 may be on the display apparatus of FIGS. 19A to 19D, the first pattern 410, the second pattern 420, and the third pattern 430 are omitted from the FIGS. 19A to 19D for convenience of illustration.

Referring to FIGS. 19A to 19D, an embodiment of the display apparatus may include a display part DP and a connection part CP. The display part DP may include a first display part DP1 and a second display part DP2. The first display part DP1 and the second display part DP2 may be apart from each other in the first direction (e.g., the +x or −x direction). However, the disclosure is not limited thereto. In an embodiment, for example, the first display part DP1 and the second display part DP2 may be apart from each other in the first direction (e.g., the +x or −x direction) and/or the second direction (e.g., the +y or −y direction).

The connection part CP may be between the first display part DP1 and the second display part DP2. The connection part CP may connect the first display part DP1 and the second display part DP2 to each other.

Figure 19A:
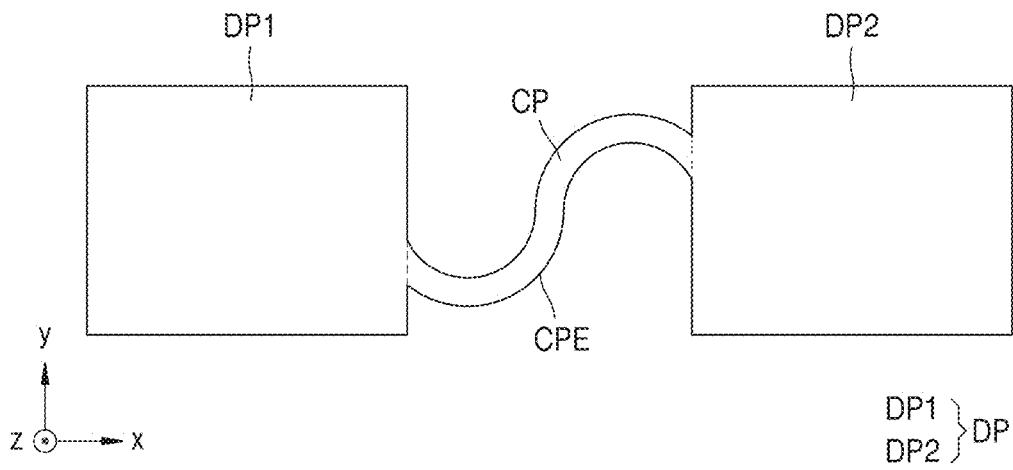
FIGS. 19A to 19D are plan views schematically illustrating a display apparatus according to an embodiment.

Referring to FIG. 19A, in an embodiment, at least a portion of the connection part CP may have a curved shape in a plan view. In such an embodiment, an edge CPE of the connection part CP may have a curved shape. The edge CPE of the connection part CP may extend in the first direction (e.g., the +x or −x direction), and may have a shape that is convex downward and convex upward in the second direction (e.g., the +y or −y direction).

Figure 19B:
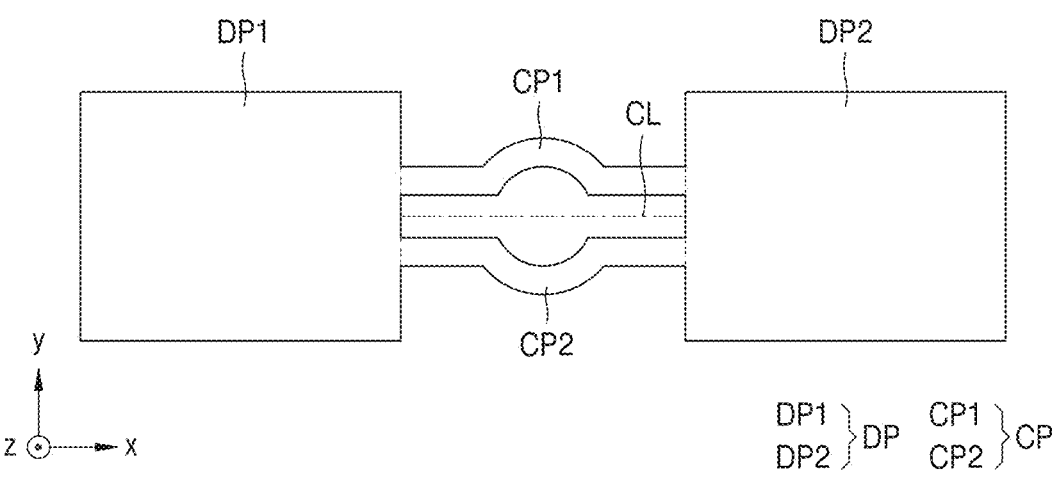

Referring to FIG. 19B, in an embodiment, the connection part CP may include a first connection part CP1 and a second connection part CP2. The first connection part CP1 and the second connection part CP2 may be between the first display part DP1 and the second display part DP2 and may connect the first display part DP1 to the second display part DP2.

In an embodiment, at least a portion of the first connection part CP1 and at least a portion of the second connection part CP2 may have a curved shape in a plan view. The first connection part CP1 may extend in the first direction (e.g., the +x or −x direction), and at least a portion of the first connection part CP1 may have a convex shape in the +y direction. In an embodiment, the second connection part CP2 may extend in the first direction (e.g., the +x or −x direction), and at least a portion of the second connection part CP2 may have a convex shape in the −y direction.

In an embodiment, the first connection part CP1 and the second connection part CP2 may be symmetrical with respect to an imaginary line CL extending in the first direction (e.g., the +x or −x direction).

Figure 19C:
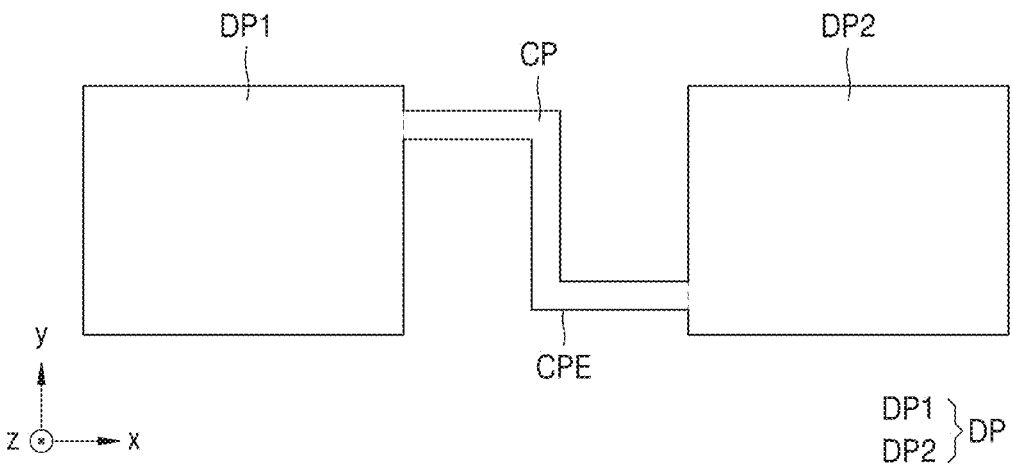

Referring to FIG. 19C, in an embodiment, the connection part CP may have a straight-line shape. In such an embodiment, the edge CPE of the connection part CP may have a straight-line shape. The connection part CP may extend in the first direction (e.g., the +x or −x direction) and/or the second direction (e.g., the +y or −y direction).

Figure 19D:
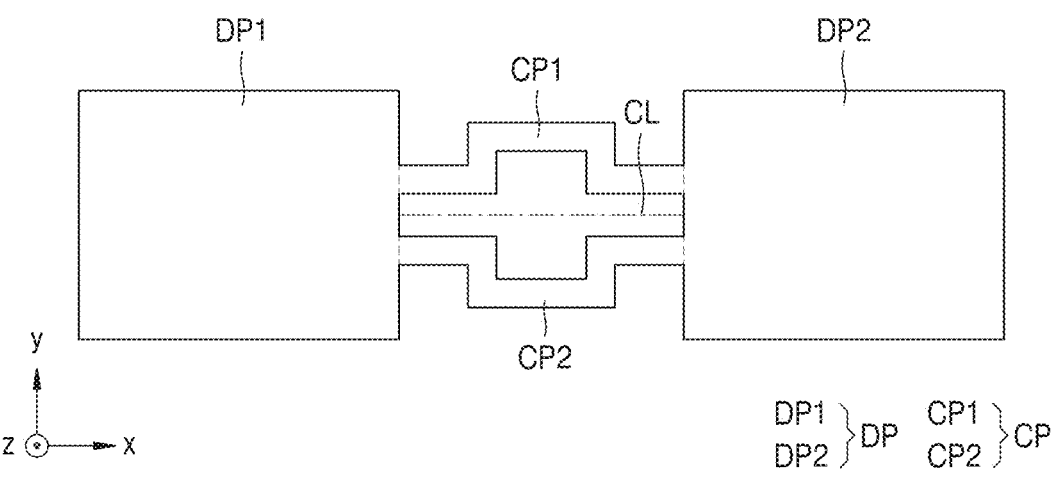

Referring to FIG. 19D, in an embodiment, the connection part CP may include a first connection part CP1 and a second connection part CP2. The first connection part CP1 and the second connection part CP2 may be between the first display part DP1 and the second display part DP2 and may connect the first display part DP1 to the second display part DP2.

In an embodiment, the first connection part CP1 and the second connection part CP2 may have a straight-line shape in a plan view. The first connection part CP1 may extend in the first direction (e.g., the +x or −x direction), and at least a portion of the first connection part CP1 may have a convex shape in the +y direction. In such an embodiment, the second connection part CP2 may extend in the first direction (e.g., the +x or −x direction), and at least a portion of the second connection part CP2 may have a convex shape in the −y direction.

In an embodiment, the first connection part CP1 and the second connection part CP2 may be symmetrical with respect to an imaginary line CL extending in the first direction (e.g., the +x or −x direction).

Figure 20A:
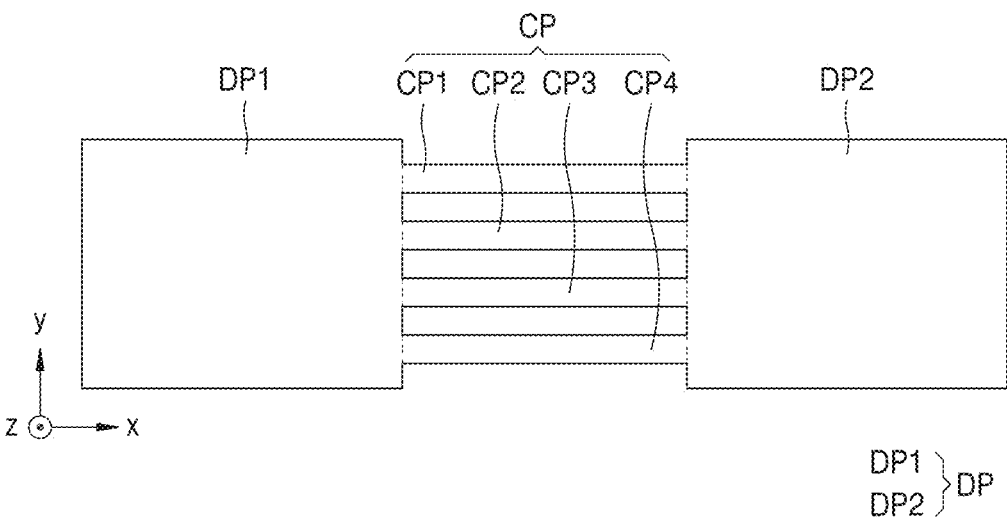
FIGS. 20A to 20C are plan views schematically illustrating a display apparatus according to an embodiment.
Figure 20B:
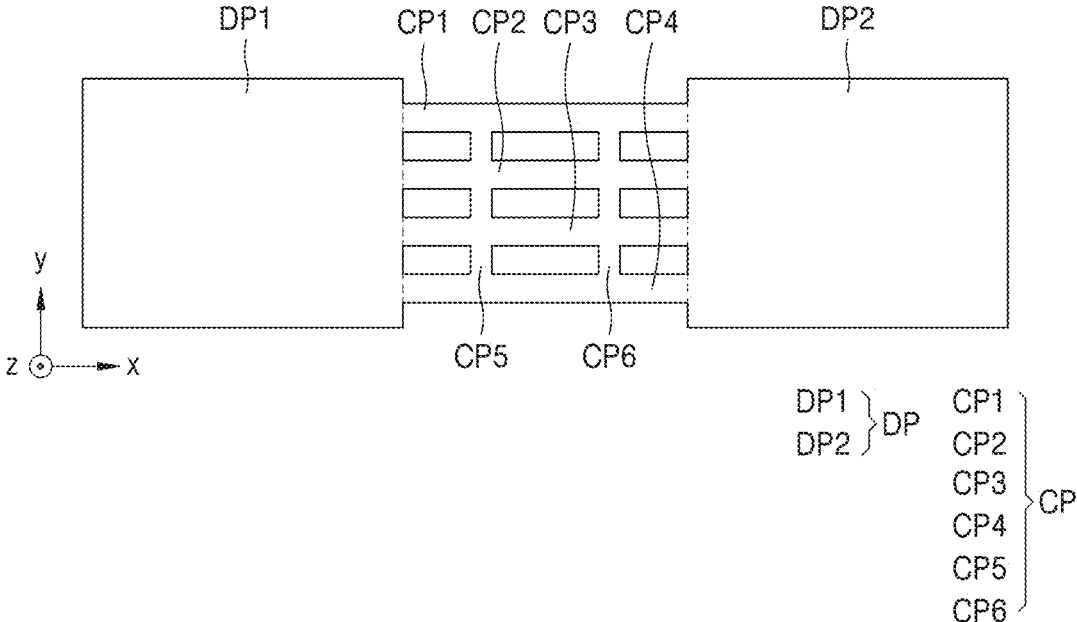
Figure 20C:
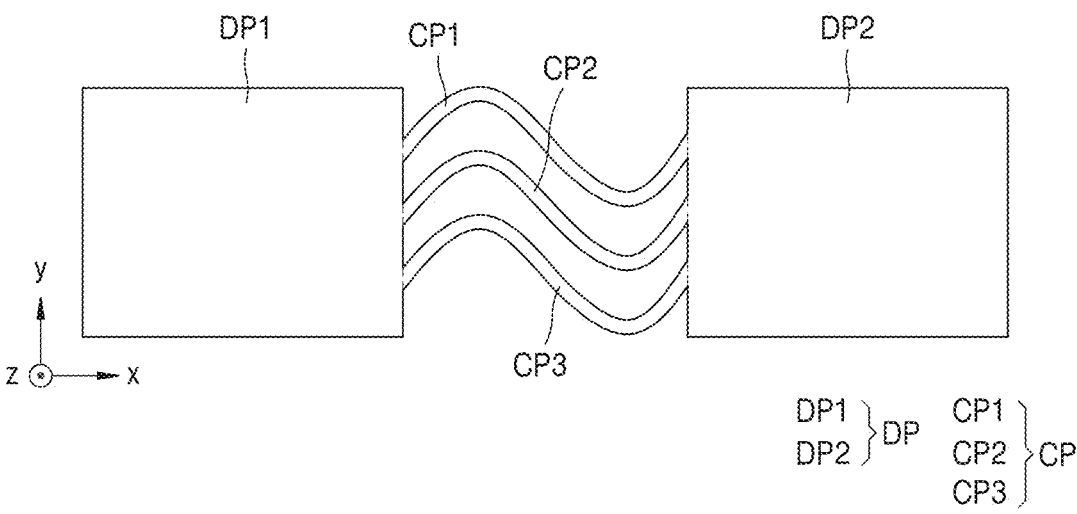

FIGS. 20A to 20C are plan views schematically illustrating a display apparatus according to an embodiment. In such an embodiment, although the first pattern 410, the second pattern 420, and the third pattern 430 described above with reference to FIGS. 9 to 13 may be on the display apparatus of FIGS. 20A to 20C, the first pattern 410, the second pattern 420, and the third pattern 430 are omitted from FIGS. 20A to 20C for convenience of illustration.

Referring to FIG. 20A, an embodiment of the display apparatus may include a display part DP and a connection part CP. The display part DP may include a first display part DP1 and a second display part DP2. The connection part CP may include a first connection part CP1, a second connection part CP2, a third connection part CP3, and a fourth connection part CP4.

The first display part DP1 and the second display part DP2 may be apart from each other in the first direction (e.g., the +x or −x direction). However, the disclosure is not limited thereto. In an embodiment, for example, the first display part DP1 and the second display part DP2 may be apart from each other in the first direction (e.g., the +x or −x direction) and/or the second direction (e.g., the +y or −y direction).

The first to fourth connection parts CP1 to CP4 may extend in the first direction (e.g., the +x or −x direction). However, the disclosure is not limited thereto. In an embodiment, for example, the first to fourth connection parts CP1 to CP4 may extend in the first direction (e.g., the +x or −x direction) and/or the second direction (e.g., the +y or −y direction).

In an embodiment, the first to fourth connection parts CP1 to CP4 may be between the first display part DP1 and the second display part DP2. The first display part DP1 and the second display part DP2 may be connected to each other by the first to fourth connection parts CP1 to CP4.

Although FIG. 20A illustrates an embodiment where four connection parts CP are between the first display part DP1 and the second display part DP2, the disclosure is not limited thereto. Alternatively, various numbers of connection parts CP, for example, two or three connection parts CP, may be between the first display part DP1 and the second display part DP2.

Referring to FIG. 20B, an embodiment of the display apparatus may include a display part DP and a connection part CP. The display part DP may include a first display part DP1 and a second display part DP2. The connection part CP may include a first connection part CP1, a second connection part CP2, a third connection part CP3, a fourth connection part CP4, a fifth connection part CP5, and a sixth connection part CP6.

The first display part DP1 and the second display part DP2 may be apart from each other in the first direction (e.g., the +x or −x direction). However, the disclosure is not limited thereto. In an embodiment, for example, the first display part DP1 and the second display part DP2 may be apart from each other in the first direction (e.g., the +x or −x direction) and/or the second direction (e.g., the +y or −y direction).

The first to fourth connection parts CP1 to CP4 may extend in the first direction (e.g., the +x or −x direction). However, the disclosure is not limited thereto. In an embodiment, for example, the first to fourth connection parts CP1 to CP4 may extend in the first direction (e.g., the +x or −x direction) and/or the second direction (e.g., the +y or −y direction).

The fifth connection part CP5 and the sixth connection part CP6 may extend in the second direction (e.g., the +y or −y direction). However, the disclosure is not limited thereto. The fifth connection part CP5 and the sixth connection part CP6 may extend in the first direction (e.g., the +x or −x direction) and/or the second direction (e.g., the +y or −y direction). In an embodiment, for example, the fifth connection part CP5 and the sixth connection part CP6 may be connected to the first to fourth connection parts CP1 to CP4. The fifth connection part CP5 and the sixth connection part CP6 may prevent the first to fourth connection parts CP1 to CP4 from being bonded to each other.

Referring to FIG. 20C, an embodiment of the display apparatus may include a display part DP and a connection part CP. The display part DP may include a first display part DP1 and a second display part DP2. The connection part CP may include a first connection part CP1, a second connection part CP2, and a third connection part CP3.

The first display part DP1 and the second display part DP2 may be apart from each other in the first direction (e.g., the +x or −x direction). However, the disclosure is not limited thereto. In an embodiment, for example, the first display part DP1 and the second display part DP2 may be apart from each other in the first direction (e.g., the +x or −x direction) and/or the second direction (e.g., the +y or −y direction).

The first to third connection parts CP1 to CP3 may extend in the first direction (e.g., the +x or −x direction). However, the disclosure is not limited thereto. In an embodiment, for example, the first to third connection parts CP1 to CP3 may extend in the first direction (e.g., the +x or −x direction) and/or the second direction (e.g., the +y or −y direction).

In an embodiment, the first to connection parts CP1 to CP3 may have a curved shape. In an embodiment, for example, the first to third connection parts CP1 to CP3 may extend in the first direction (e.g., the +x or −x direction), and at least a portion of the first to third connection parts CP1 to CP3 may have a shape that is convex upward and convex downward.

FIGS. 21A to 21F are cross-sectional views schematically illustrating a display apparatus according to an embodiment. In such an embodiment, although the first pattern 410, the second pattern 420, and the third pattern 430 described above with reference to FIGS. 9 to 13 may be on the display apparatus of FIGS. 21A to 21F, the first pattern 410, the second pattern 420, and the third pattern 430 are omitted from FIGS. 21A to 21F for convenience of illustration.

Figure 21A:
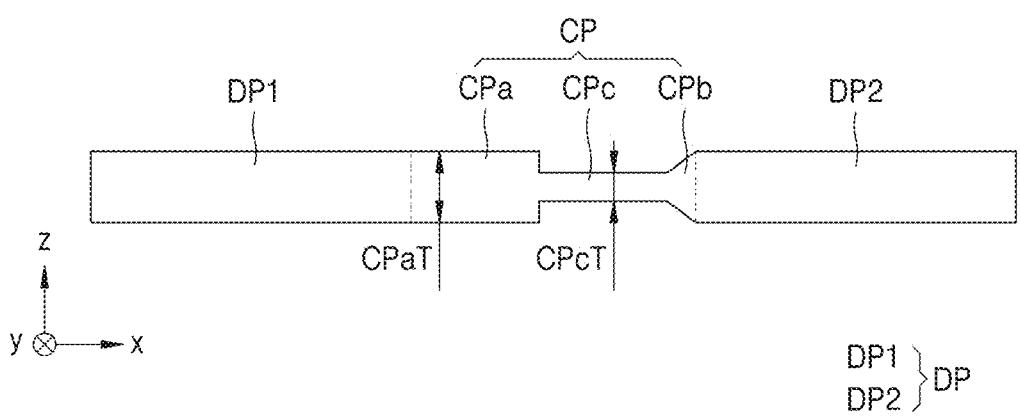
FIGS. 21A to 21F are cross-sectional views schematically illustrating a display apparatus according to an embodiment.

Referring to FIG. 21A, an embodiment of the display apparatus may include a display part DP and a connection part CP. The display part DP may include a first display part DP1 and a second display part DP2. The connection part CP may include a first part CPa adjacent to the first display part DP1, a second part CPb adjacent to the second display part DP2, and a third part CPc between the first part CPa and the second part CPb. In an embodiment, for example, the third part CPc may correspond to a central portion of the connection part CP, and the first part CPa and the second part CPb may correspond to an outer portion of the connection part CP. In such an embodiment, the first part CPa, the second part CPb, and the third part CPc may be integral with each other.

In an embodiment, a thickness CPaT of the first part CPa may be greater than a thickness CPcT of the third part CPc. In such an embodiment, the thickness of the central portion of the connection part CP may be less than the thickness of the outer portion of the connection part CP. In such an embodiment where the thickness of the central portion of the connection part CP is less than the thickness of the outer portion of the connection part CP, the central portion of the connection part CP may be three-dimensionally modified more easily than the outer portion of the connection part CP.

In an embodiment, in a side view(or, cross-sectional view), the first part CPa may have a rectangular shape and the second part CPb may have a triangular shape. In an embodiment, for example, the thickness CPaT of the first part CPa may be uniform, and the thickness of the second part CPb may gradually decrease from the second part CPb adjacent to the second display part DP2 to the second part CPb adjacent to the third part CPc. Therefore, the second part CPb may be three-dimensionally modified more easily than the first part CPa.

Figure 21B:
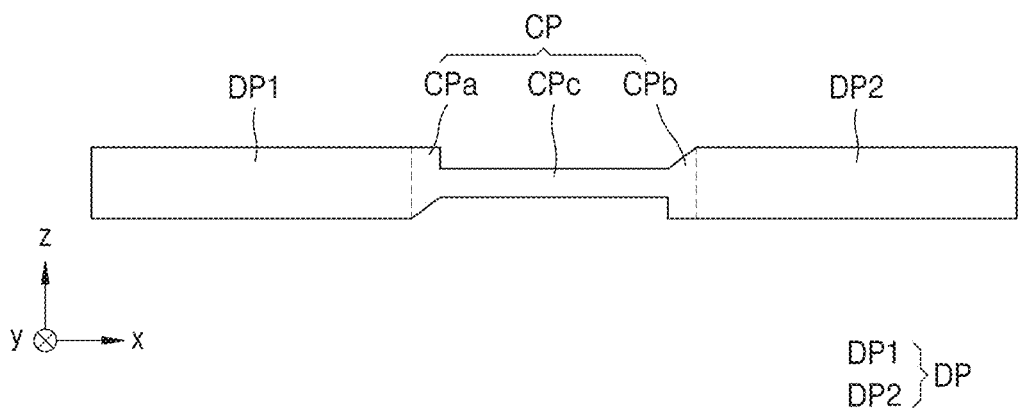

Referring to FIG. 21B, an embodiment of the display apparatus may include a display part DP and a connection part CP. The display part DP may include a first display part DP1 and a second display part DP2. The connection part CP may include a first part CPa adjacent to the first display part DP1, a second part CPb adjacent to the second display part DP2, and a third part CPc between the first part CPa and the second part CPb.

In an embodiment, the upper portion of the first part CPa may have a rectangular shape, and the lower portion of the first part CPa may have a triangular shape. In such an embodiment where the upper portion of the first part CPa has a rectangular shape and the lower portion of the first part CPa has a triangular shape, the first part CPa may be easily deformed in the −z direction.

In an embodiment, the lower portion of the second part CPb may have a rectangular shape, and the upper portion of the second part CPb may have a triangular shape. In such an embodiment, where the lower portion of the second part CPb has a rectangular shape and the upper portion of the second part CPb has a triangular shape, the second part CPb may be easily deformed in the +z direction.

Figure 21C:
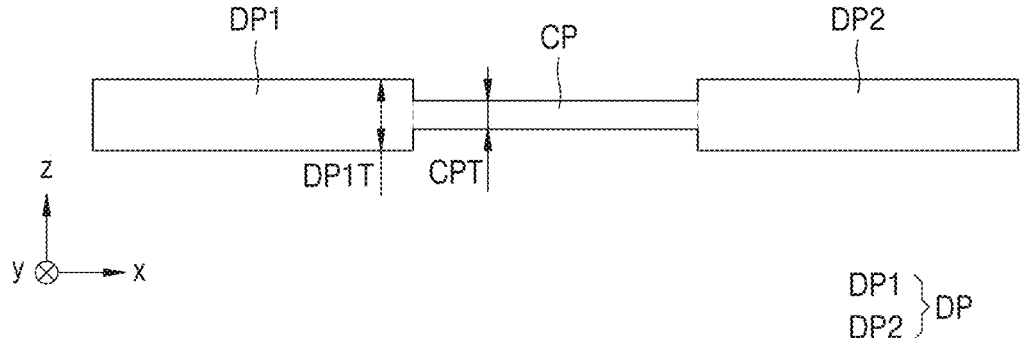
Figure 21D:
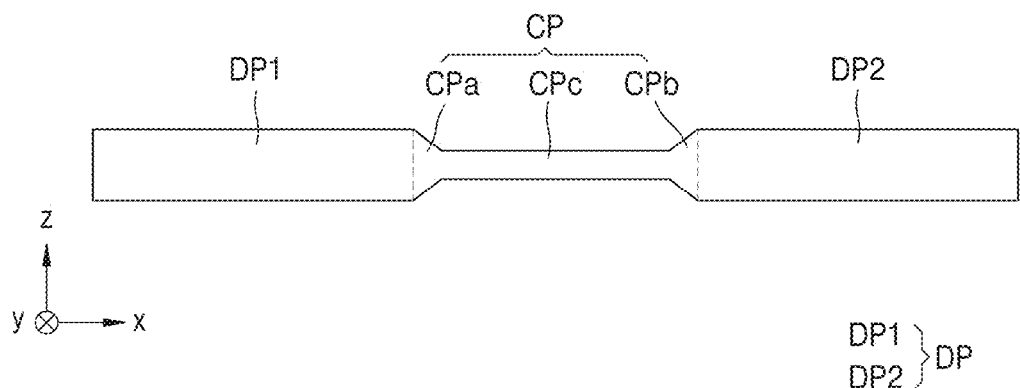
Figure 21E:
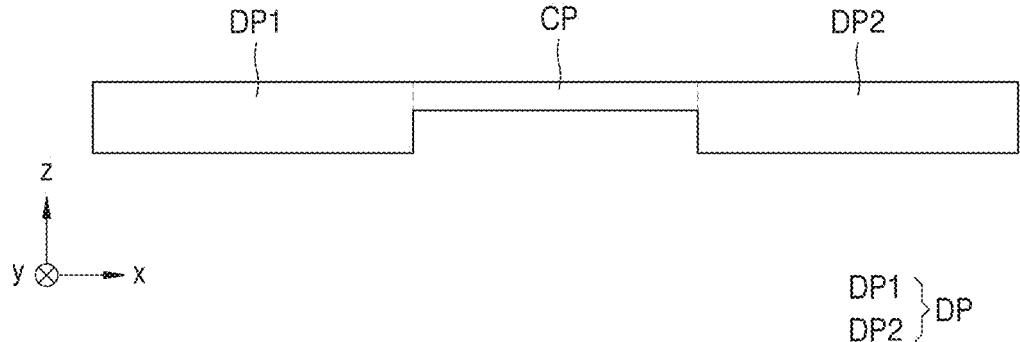
Figure 21F:
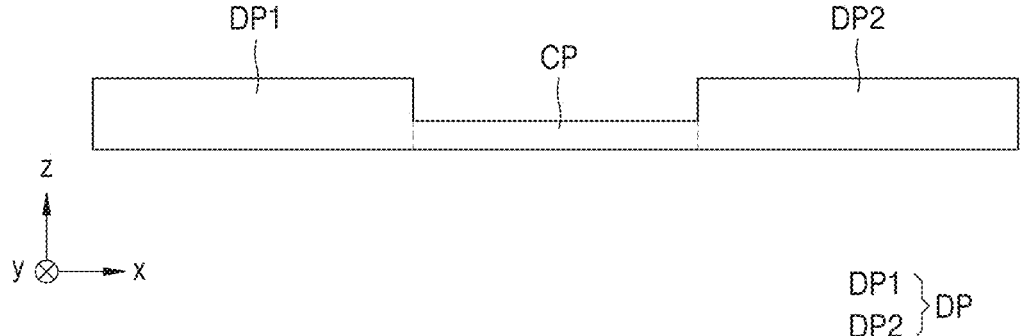

Referring to FIGS. 21C, 21E, and 21F, an embodiment of the display apparatus may include a display part DP and a connection part CP. The display part DP may include a first display part DP1 and a second display part DP2.

In an embodiment, a thickness CPT of the connection part CP may be less than a thickness DP1T of the first display part DP1 in a side view(or, cross-sectional view). In such an embodiment, the thickness of the connection part CP may be less than the thickness of the display part DP. In such an embodiment where the thickness of the connection part CP is less than the thickness of the display part DP, the connection part CP may be three-dimensionally deformed more easily.

In an embodiment, the connection part CP is between the first display part DP1 and the second display part DP2. In an embodiment, as illustrated in FIG. 21C, the connection part CP may be in the middle of the first display part DP1 and the second display part DP2. In an embodiment, as illustrated in FIG. 21E, the connection part CP may be adjacent to the upper surface of the first display part DP1 and the upper surface of the second display part DP2. In an embodiment, as illustrated in FIG. 21F, the connection part CP may be adjacent to the lower surface of the first display part DP1 and the lower surface of the second display part DP2.

In an embodiment where the connection part CP is adjacent to the upper surface of the first display part DP1 and the upper surface of the second display part DP2, stretchability in the +z direction may be improved. In an embodiment where the connection part CP is adjacent to the lower surface of the first display part DP1 and the lower surface of the second display part DP2, stretchability in the −z direction may be improved.

Referring to FIG. 21D, an embodiment of the display apparatus may include a display part DP and a connection part CP. The display part DP may include a first display part DP1 and a second display part DP2. The connection part CP may include a first part CPa adjacent to the first display part DP1, a second part CPb adjacent to the second display part DP2, and a third part CPc between the first part CPa and the second part CPb.

In an embodiment, the first part CPa and the second part CPb may have a triangular shape in a side view(or, cross-sectional view). The thickness of the first part CPa may gradually decrease from the first part CPa adjacent to the first display part DP1 to the first part CPa adjacent to the third part CPc. Also, the thickness of the second part CPb may gradually decrease from the second part CPb adjacent to the second display part DP2 to the second part CPb adjacent to the third part CPc.

Figure 22:
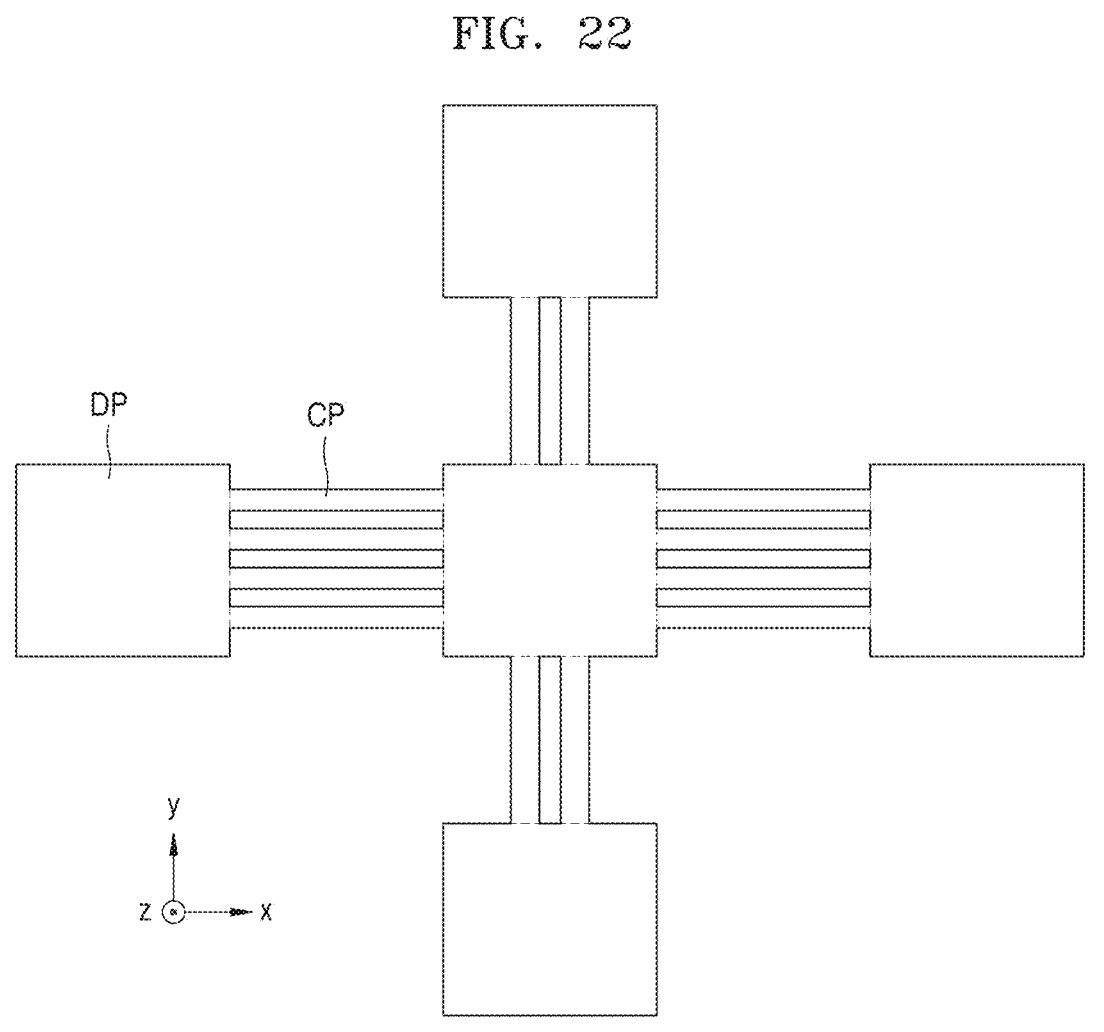

FIG. 22 is a plan view schematically illustrating a portion of a display apparatus, according to an embodiment.

Referring to FIG. 22, an embodiment of the display apparatus may include a display part DP and a connection part CP. In an embodiment, a plurality of display parts DP may be provided. The display parts DP may be apart from each other in the first direction (e.g., the +x or −x direction) and/or the second direction (e.g., the +y or −y direction).

In an embodiment, a plurality of connection parts CP may be provided. In an embodiment, the connection part CP may be between the display parts DP and extend in the first direction (e.g., +x or −x direction) and/or the second direction (e.g., the +y or −y direction).

In an embodiment, four connection parts CP may be between the display parts DP apart from each other in the first direction (e.g., the +x or −x direction), and two connection parts CP may be between the display parts DP apart from each other in the second direction (e.g., the +y or −y direction). However, the disclosure is not limited thereto. In such an embodiment, the number of connection parts CP may be variously modified.

The first-direction length of the connection part CP between the display parts DP apart from each other in the first direction (e.g., the +x or −x direction) may be different from the second-direction length of the connection part CP between the display parts DP apart from each other in the second direction (e.g., the +y or −y direction). However, the disclosure is not limited thereto. In an embodiment, the first-direction length of the connection part CP between the display parts DP apart from each other in the first direction (e.g., the +x or −x direction) may be equal to the second-direction length of the connection part CP between the display parts DP apart from each other in the second direction (e.g., the +y or −y direction).

The second-direction width of the connection part CP between the display parts DP apart from each other in the first direction (e.g., the +x or −x direction) may be different from the first-direction width of the connection part CP between the display parts DP apart from each other in the second direction (e.g., the +y or −y direction). However, the disclosure is not limited thereto. In an embodiment, the second-direction width of the connection part CP between the display parts DP apart from each other in the first direction (e.g., the +x or −x direction) may be equal to the first-direction width of the connection part CP between the display parts DP apart from each other in the second direction (e.g., the +y or −y direction).

Figure 23:
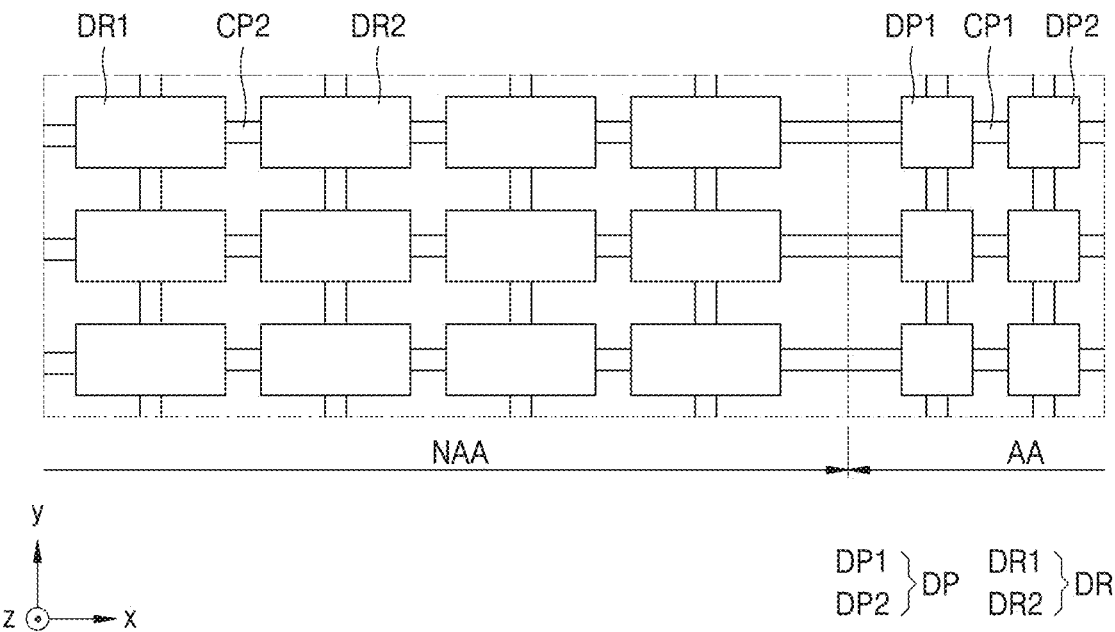
FIG. 23 is a plan view schematically illustrating a portion of a display apparatus, according to an embodiment.

FIG. 23 is a plan view schematically illustrating a portion of a display apparatus, according to an embodiment.

Referring to FIG. 23, an embodiment of the display apparatus may include a display area AA and a non-display area NAA outside the display area AA. In such an embodiment, it may be understood that the display apparatus includes a substrate (see 100 of FIG. 2), and the substrate 100 includes the display area AA and the non-display area NAA.

In an embodiment, a display part DP and a first connection part CP1 may be in the display area AA. The display part DP may include a first display part DP1 and a second display part DP2. The first connection part CP1 may connect the first display part DP1 and the second display part DP2 to each other.

In an embodiment, as described above, the first display part DP1 and the second display part DP2 may include a first pixel (see PX1 of FIG. 1) and a second pixel (see PX2 of FIG. 1), respectively. Therefore, the display area AA may be configured to display an image through the first pixel (see PX1 of FIG. 1) and the second pixel (see PX2 of FIG. 1).

In an embodiment, a driver DR and a second connection part CP2 may be in the non-display area NAA. The driver DR may include a first driver DR1 and a second driver DR2. The second connection part CP2 may connect the first driver DR1 to the second driver DR2.

The driver DR in the non-display area NAA may include a driving circuit configured to drive sub-pixels in the display area AA. In an embodiment, for example, the driver DR may include at least one of a scan driving circuit, an emission control driving circuit, and a data driving circuit. Alternatively, the driver DR may be configured to supply a first power supply voltage (see ELVDD of FIG. 3) and a second power supply voltage (see ELVSS of FIG. 3).

In an embodiment, the first connection part CP1 and the second connection part CP2 may have a straight-line shape. However, the disclosure is not limited thereto. In an embodiment, at least one of the first connection part CP1 and the second connection part CP2 may have a curved shape.

In an embodiment, the first connection part CP1 and the second connection part CP2 may have different widths or different lengths from each other. However, the disclosure is not limited thereto. In an embodiment, for example, the first connection part CP1 and the second connection part CP2 may have the same width or the same length.

In an embodiment, the first connection part CP1 and the second connection part CP2 may include different materials from each other. However, the disclosure is not limited thereto. In an embodiment, the first connection part CP1 and the second connection part CP2 may include a same material as each other.

According to one or more embodiments, display apparatuses with improved flexibility may be implemented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising a display panel in which a penetration opening is defined,
wherein the display panel comprises:
a first display part on which a first pixel is disposed;
a second display part on which a second pixel is disposed; and
a connection part connected between the first display part and the second display part, and wherein the display apparatus further comprises:
a first pattern overlapping the first display part and adjacent to the connection part;
a second pattern overlapping the connection part and adjacent to the first display part; and
a third pattern overlapping the connection part and adjacent to the second display part,
wherein the second pattern extends to be oriented along a boundary between the first display part and the connection part, and the third pattern extends to be oriented along a boundary between the second display part and the connection part.

2. The display apparatus of claim 1, wherein the first pattern is on an upper surface of the first display part.

3. The display apparatus of claim 1, wherein the second pattern and the third pattern are on an upper surface of the connection part.

4. The display apparatus of claim 1, wherein at least one of the second pattern and the third pattern is recessed into the connection part.

5. The display apparatus of claim 1, wherein a width of the connection part is greater than or equal to a width of the second pattern in a plan view.

6. The display apparatus of claim 1, wherein a Young's modulus of the second pattern is different from a Young's modulus of the connection part.

7. The display apparatus of claim 1, wherein an edge of the first display part, an edge of the second display part, and an edge of the connection part define at least a portion of the penetration opening.

8. The display apparatus of claim 1, wherein an edge of the first display part comprises a plurality of concave parts recessed into the first display part in a plan view.

9. The display apparatus of claim 1, wherein a width of the connection part in a plan view gradually increases from a central portion of the connection part toward an outer portion of the connection part adjacent to the first display part.

10. The display apparatus of claim 1, wherein an edge of the connection part has a straight-line shape or a curved shape in a plan view.

11. The display apparatus of claim 1, wherein
the connection part comprises a first connection part and a second connection part, and
the first connection part and the second connection part are symmetrical with respect to an imaginary line extending in a first direction.

12. The display apparatus of claim 1, wherein the connection part comprises a first part adjacent to the first display part, a second part adjacent to the second display part, and a third part between the first part and the second part.

13. The display apparatus of claim 12, wherein a width of the first part is different from a width of the third part in a plan view.

14. The display apparatus of claim 12, wherein a thickness of the third part is less than a thickness of the first part in a side view.

15. The display apparatus of claim 1, wherein a thickness of the connection part is less than a thickness of the first display part in a side view.

16. A display apparatus comprising:
a substrate comprising a display area and a non-display area outside the display area;
a first display part, a second display part, and a first connection part connected between the first display part and the second display part, wherein the first display part, the second display part, and the first connection part are on the display area of the substrate;

a first driver, a second driver, and a second connection part connected between the first driver and the second driver, wherein the first driver, the second driver, and the second connection part are on the non-display area of the substrate;

a first pattern overlapping the first display part and adjacent to the connection part;

a second pattern overlapping the connection part and adjacent to the first display part; and a third pattern overlapping the connection part and adjacent to the second display part, wherein the second pattern extends to be oriented along a boundary between the first display part and the connection part, and the third pattern extends to be oriented along a boundary between the second display part and the connection part.

17. The display apparatus of claim 16, wherein the first pattern is on an upper surface of the first display part.

18. The display apparatus of claim 16, wherein the second pattern and the third pattern are on an upper surface of the connection part.

19. The display apparatus of claim 16, wherein at least one of the second pattern and the third pattern is recessed into the connection part.

20. An electronic device comprising a display apparatus, wherein the display apparatus comprises:

a substrate comprising a display area and a non-display area outside the display area;

a first display part, a second display part, and a first connection part connected between the first display part and the second display part, wherein the first display part, the second display part, and the first connection part are on the display area of the substrate;

a first driver, a second driver, and a second connection part connected between the first driver and the second driver, wherein the first driver, the second driver, and the second connection part are on the non-display area of the substrate;

a first pattern overlapping the first display part and adjacent to the connection part;

a second pattern overlapping the connection part and adjacent to the first display part; and a third pattern overlapping the connection part and adjacent to the second display part, wherein the second pattern extends to be oriented along a boundary between the first display part and the connection part, and the third pattern extends to be oriented along a boundary between the second display part and the connection part.

\* \* \* \* \*